US012796237B2

(12) United States Patent
Kim et al.

(10) Patent No.: US 12,796,237 B2
(45) Date of Patent: Nov. 10, 2026

(54) DISPLAY DEVICE

(71) Applicant: Samsung Display Co., LTD., Yongin-si (KR)

(72) Inventors: Dae Hyeon Kim, Yongin-si (KR); Sang Yeol Kim, Yongin-si (KR); Sung Soo Lee, Yongin-si (KR); Dong Seob Jeong, Yongin-si (KR); Han Ggoch Nu Ri Jo, Yongin-si (KR); Bo Mi Choi, Yongin-si (KR); Seung Soo Hong, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 87 days.

(21) Appl. No.: 18/946,763

(22) Filed: Nov. 13, 2024

(65) Prior Publication Data

US 2025/0169292 A1 May 22, 2025

(30) Foreign Application Priority Data

Nov. 16, 2023 (KR) ........................ 10-2023-0159450

(51) Int. Cl.
*H10K 59/122* (2023.01)
*H10K 50/17* (2023.01)
(Continued)

(52) U.S. Cl.
CPC ......... *H10K 59/122* (2023.02); *H10K 50/171* (2023.02); *H10K 50/19* (2023.02);
(Continued)

(58) Field of Classification Search
CPC ........... H10K 59/80522; H10K 59/122; H10K 59/1213; H10K 59/123; H10K 59/131; G09G 3/32; G09G 2300/0809
See application file for complete search history.

(56) References Cited

U.S. PATENT DOCUMENTS

| | | | | |
|---|---|---|---|---|
| 9,059,426 | B2 * | 6/2015 | An | H10H 20/80 |
| 11,088,339 | B2 | 8/2021 | Kim et al. | |

(Continued)

FOREIGN PATENT DOCUMENTS

| | | | |
|---|---|---|---|
| KR | 10-1841892 | B1 | 3/2018 |
| KR | 10-2020-0014199 | A | 2/2020 |

(Continued)

*Primary Examiner* — Mary Ellen Bowman
(74) *Attorney, Agent, or Firm* — Womble Bond Dickinson (US) LLP

(57) ABSTRACT

According to an embodiment of the disclosure, a display device is provided. The display device includes a substrate, and a light emitting element layer on the substrate and including an anode electrode portion, a cathode electrode portion, a light emitting structure electrically connected between the anode electrode portion and the cathode electrode portion, and a pixel defining layer. The light emitting structure includes a first light emitting structure included in a first sub-pixel and a second light emitting structure included in a second sub-pixel adjacent to the first sub-pixel. The pixel defining layer is between the first sub-pixel and the second sub-pixel and includes a separating structure between the first light emitting structure and the second light emitting structure. The cathode electrode portion includes a first cathode electrode including an opaque conductive material and a second cathode electrode including a transparent conductive material.

32 Claims, 23 Drawing Sheets

(51) Int. Cl.

| | |
|---|---|
| ***H10K 50/19*** | (2023.01) |
| ***H10K 59/80*** | (2023.01) |
| ***H10K 102/00*** | (2023.01) |
| ***H10K 102/10*** | (2023.01) |

(52) U.S. Cl.

CPC . *H10K 59/80518* (2023.02); *H10K 59/80524* (2023.02); *H10K 2102/103* (2023.02); *H10K 2102/351* (2023.02)

(56) References Cited

U.S. PATENT DOCUMENTS

| | | | | |
|---|---|---|---|---|
| 11,522,028 | B2 | 12/2022 | Lim et al. | |
| 11,910,655 | B2* | 2/2024 | Kinjo | H10K 59/122 |
| 2014/0151652 | A1* | 6/2014 | Im | H10K 59/1315 257/40 |
| 2015/0144902 | A1* | 5/2015 | Do | H10K 59/1201 257/40 |
| 2016/0155790 | A1* | 6/2016 | Lee | H10D 84/01 438/34 |
| 2019/0326376 | A1* | 10/2019 | Huo | H10K 59/1201 |
| 2021/0391400 | A1* | 12/2021 | Kim | H10K 59/121 |
| 2024/0224694 | A1* | 7/2024 | Lee | H10K 59/38 |
| 2024/0357908 | A1* | 10/2024 | Yang | H10K 59/1201 |
| 2025/0081681 | A1* | 3/2025 | Seo | G06F 3/0412 |
| 2025/0098433 | A1* | 3/2025 | Lazo Martinez | H10K 59/122 |
| 2026/0047316 | A1* | 2/2026 | You | B60K 35/22 |

FOREIGN PATENT DOCUMENTS

| | | | |
|---|---|---|---|
| KR | 10-2021-0017179 | A | 2/2021 |
| KR | 10-2021-0130781 | A | 11/2021 |
| WO | WO 2010/062643 | A1 | 6/2010 |
| WO | WO 2020/197616 | A1 | 10/2020 |

* cited by examiner

TR: TR1, TR2
CAP: CE1, CE2, CE_M
CE1: CE1_1, CE1_2
ANP: ANP1, ANP2
PDL: PTR1, PTR2, PTR3

TR: TR1, TR2
CAP: CE1, CE2, DS, CE_M
CE1: CE1_1, CE1_2
ANP: ANP1, ANP2
PDL: PTR1, PTR2, PTR3

CAP: CE1, CE2, CE_M
CE1: CE1_1, CE1_2
ANP: ANP1, ANP2
PDL: PTB1, PTB2, PTP1, PTP2, PTP3
PTP: PTP1, PTP2, PTP3
PTB: PTB1, PTB2

CAP: CE1, CE2, DS, CE_M
CE1: CE1_1, CE1_2
ANP: ANP1, ANP2
PDL: PTB1, PTB2, PTP1, PTP2, PTP3
PTP: PTP1, PTP2, PTP3
PTB: PTB1, PTB2

TR: TR1, TR2
CAP: CE1, CE2, CE_M
CE1: CE1_1, CE1_2
ANP: ANP1, ANP2
PDL: BPDL, PPDL

TR: TR1, TR2
CAP: CE1, CE2, DS, CE_M
CE1: CE1_1, CE1_2
ANP: ANP1, ANP2
PDL: BPDL, PPDL

DISPLAY DEVICE

CROSS-REFERENCE TO RELATED APPLICATION

The present application claims priority to and the benefit of Korean Patent Application No. 10-2023-0159450, filed on Nov. 16, 2023, in the Korean Intellectual Property Office, the entire disclosure of which is hereby incorporated by reference.

BACKGROUND

1. Field

Embodiments of the disclosure relate to a display device.

2. Description of the Related Art

As interest in an information display has recently increased, research and development on a display device is substantially continuously being conducted.

The display device may include sub-pixels respectively including an organic light emitting diode (OLED). The OLED is an active light emitting display element that has features of not only having a wide viewing angle and excellent contrast, but also being able to be driven at a low voltage, being lightweight and thin, and having a fast response speed.

The organic light emitting diode may include a hole transport part, an electron transport part, and a light emitting layer between the hole transport part and the electron transport part. A hole provided from the hole transport part and an electron provided from the electron transport part may recombine in the light emitting layer to generate an exciton. The generated exciton may change from an excited state to a ground state and, as a result, light may be generated.

The OLED may include a cathode electrode configured to provide an electron to emit light. The cathode electrode may be configured to be a common electrode for each of different sub-pixels. In order for the cathode electrode to supply a suitable cathode signal to each OLED, the cathode electrode should be suitably or appropriately patterned throughout areas where the sub-pixels are formed.

SUMMARY

An aspect of embodiments of the present disclosure is to provide a display device having improved display quality by reducing a risk due to a leakage current and/or the like.

An aspect of embodiments of the present disclosure is to provide a display device in which a risk such as a voltage drop and/or the like is reduced by providing a detailed cathode electrode structure.

According to an embodiment of the disclosure, a display device may include a substrate, and a light emitting element layer on the substrate and including an anode electrode portion, a cathode electrode portion, a light emitting structure electrically connected between the anode electrode portion and the cathode electrode portion, and a pixel defining layer. The light emitting structure may include a first light emitting structure included in a first sub-pixel and a second light emitting structure included in a second sub-pixel adjacent to the first sub-pixel. The pixel defining layer may be between the first sub-pixel and the second sub-pixel and may include a separating structure between the first light emitting structure and the second light emitting structure. The cathode electrode portion may include a first cathode electrode including an opaque conductive material and a second cathode electrode including a transparent conductive material. At least a portion of the first cathode electrode may be cut by the separating structure. The second cathode electrode may be provided across the first sub-pixel and the second sub-pixel. The second cathode electrode may have a thickness greater than that of the first cathode electrode.

According to an embodiment, the first cathode electrode and the second cathode electrode may contact each other (e.g., physically contact each other).

According to an embodiment, the first cathode electrode may be directly adjacent to an uppermost surface of the light emitting structure.

According to an embodiment, the first cathode electrode may include one or more selected from the group consisting of gold (Au), silver (Ag), aluminum (Al), molybdenum (Mo), chromium (Cr), titanium (Ti), nickel (Ni), neodymium (Nd), copper (Cu), and platinum (Pt).

According to an embodiment, the second cathode electrode may include one or more selected from the group consisting of indium zinc oxide (IZO), silver nanowire (AgNW), indium tin oxide (ITO), indium gallium zinc oxide (IGZO), antimony zinc oxide (AZO), indium tin zinc oxide (ITZO), zinc oxide (ZnO), tin oxide ($SnO_2$), carbon nano tube, and graphene.

According to an embodiment, the first cathode electrode may have a thickness in a range of 100 Å to 180 Å.

According to an embodiment, the second cathode electrode may have a thickness in a range of 600 Å to 800 Å.

According to an embodiment, the cathode electrode portion may further include an intermediate structure between the first cathode electrode and the second cathode electrode. The intermediate structure may include an N-type intermediate layer, a P-type intermediate layer on the N-type intermediate layer, and an intermediate electron injection layer on the P-type intermediate layer.

According to an embodiment, the N-type intermediate layer may be adjacent to the anode electrode portion. The P-type intermediate layer may be adjacent to the second cathode electrode.

According to an embodiment, the N-type intermediate layer, the P-type intermediate layer, and the intermediate electron injection layer may be directly adjacent to each other.

According to an embodiment, the N-type intermediate layer may have a thickness in a range of 40 Å to 100 Å.

According to an embodiment, the intermediate structure may have a thickness in a range of 400 Å to 700 Å.

According to an embodiment, the separating structure may include a trench that provides a void between the first sub-pixel and the second sub-pixel. The trench may include a plurality of trenches.

According to an embodiment, the trench may have a height in a range of 450 nm to 750 nm.

According to an embodiment, the trench may have a width in a range of 60 nm to 170 nm.

According to an embodiment, the plurality of trenches may include a first trench and a second trench. Widths of each of the first trench and the second trench may be equal to a distance at which the first trench and the second trench are spaced apart from each other (e.g., the first trench and the second trench may each have a width equal to a distance at which the first trench and the second trench are spaced apart from each other).

According to an embodiment, at least a portion of the first cathode electrode may be cut on the trench. The second cathode electrode may be continuously provided on the trench.

According to an embodiment, the pixel defining layer may include a first trench formation layer that covers at least a portion of the anode electrode portion, a second trench formation layer having a width less than that of the first trench formation layer and on the first trench formation layer, and a third trench formation layer having a width less than that of the second trench formation layer and on the second trench formation layer.

According to an embodiment, the first trench formation layer may include silicon nitride (SixNy). The second trench formation layer may include silicon oxide (SixOy). The third trench formation layer may include silicon nitride (SixNy).

According to an embodiment, the light emitting structure may further include an intermediate light emitting structure on a portion of the pixel defining layer between the first trench and the second trench. The cathode electrode portion may further include an intermediate cathode electrode on the same layer as the first cathode electrode and on the intermediate light emitting structure. The intermediate cathode electrode and the first cathode electrode may be spaced apart from each other.

According to an embodiment, the pixel defining layer may include a protrusion base layer and a protrusion separator on the protrusion base layer.

According to an embodiment, the protrusion base layer may include a first protrusion base layer that covers the anode electrode portion and a second protrusion base layer on the first protrusion base layer and having a width less than that of the first protrusion base layer. The protrusion separator may include a first protrusion separator on the second protrusion base layer and having a width greater than that of the second protrusion base layer, a second protrusion separator on the first protrusion separator and having a width less than that of the first protrusion separator, and a third protrusion separator on the second protrusion separator and having a width less than that of the second protrusion separator.

According to an embodiment, the light emitting structure may further include an intermediate light emitting structure on the protrusion separator. The cathode electrode portion may further include an intermediate cathode electrode on the intermediate light emitting structure and spaced apart from the first cathode electrode. The second cathode electrode may cover the intermediate cathode electrode and may be provided across the first sub-pixel and the second sub-pixel.

According to an embodiment, the pixel defining layer may include a base pixel defining layer and a planarization pixel defining layer on the base pixel defining layer that planarizes a step formed by the base pixel defining layer.

According to an embodiment, the light emitting structure may include a tandem structure. The tandem structure may include a first light emitting part, a first charge generation layer on the first light emitting part, a third light emitting part on the first charge generation layer, a second charge generation layer on the third light emitting part, and a second light emitting part on the second charge generation layer. Each of the first light emitting part, the second light emitting part, and the third light emitting part may include a hole transport part, a light emitting layer, and an electron transport part. The first charge generation layer and the second charge generation layer may be cut by the separating structure.

According to an embodiment, the light emitting structure may include a tandem structure. The tandem structure may include a first light emitting part, a charge generation layer on the first light emitting part, and a second light emitting part on the charge generation layer. Each of the first light emitting part and the second light emitting part may include a hole transport part, a light emitting layer, and an electron transport part. The charge generation layer may be cut by the separating structure.

According to an embodiment, the light emitting structure may include a hole transport part, a light emitting layer, and an electron transport part. The electron transport part may include a first electron transport layer and a second electron transport layer including different materials.

According to an embodiment, the display device may further include a pixel-circuit layer between the substrate and the light emitting element layer and including a pixel circuit, a reflective electrode on the pixel-circuit layer, and step formation layer between the reflective electrode and the anode electrode portion.

According to an embodiment, the light emitting structure may further include a third light emitting structure including in a third sub-pixel. The step formation layer may be provided in the first sub-pixel without being provided in the second sub-pixel and the third sub-pixel.

According to an embodiment, the light emitting structure may further include a third light emitting structure included in a third sub-pixel. The step formation layer may be provided in each of the first sub-pixel, the second sub-pixel, and the third sub-pixel. The step formation layer may have a thick thickness in the second sub-pixel and the third sub-pixel compared to the first sub-pixel.

According to an embodiment of the disclosure, a display device may include a substrate, and a light emitting element layer on the substrate and including an anode electrode portion, a cathode electrode portion, a light emitting structure electrically connected between the anode electrode portion and the cathode electrode portion, and a pixel defining layer. The light emitting structure may include a first light emitting structure included in a first sub-pixel and a second light emitting structure included in a second sub-pixel adjacent to the first sub-pixel. The pixel defining layer may be between the first sub-pixel and the second sub-pixel and may include a trench between the first light emitting structure and the second light emitting structure. The trench may include a first trench and a second trench spaced apart from each other in a direction in which the first sub-pixel and the second sub-pixel are spaced apart. A width of each of the first trench and the second trench may be in a range of 80 nm to 150 nm. A height of each of the first trench and the second trench may be in a range of 500 nm to 700 nm. The cathode electrode portion may include a first cathode electrode and a second cathode electrode including different materials (e.g., the first cathode electrode may include materials that are different from those of the second cathode electrode).

According to an embodiment of the disclosure, a display device may include a substrate, and a light emitting element layer on the substrate and including an anode electrode portion, a cathode electrode portion, a light emitting structure electrically connected between the anode electrode portion and the cathode electrode portion, and a pixel defining layer. The light emitting structure may include a first light emitting structure included in a first sub-pixel and a second light emitting structure included in a second sub-pixel adjacent to the first sub-pixel. The pixel defining layer may be between the first sub-pixel and the second sub-pixel and may include a separating structure between the first light emitting structure and the second light emitting structure. The cathode electrode portion may include a first cathode electrode, a second cathode electrode including a material different from that of the first cathode electrode, and an intermediate structure between the first cathode electrode and the second cathode electrode. The intermediate structure may include an N-type intermediate layer, a P-type intermediate layer on the N-type intermediate layer, and an intermediate electron injection layer on the P-type intermediate layer.

According to an embodiment of the disclosure, a display device having improved display quality by reducing a risk due to a leakage current and/or the like may be provided.

According to an embodiment of the disclosure, a display device in which a risk such as a voltage drop and/or the like is reduced by providing a detailed cathode electrode structure may be provided.

BRIEF DESCRIPTION OF THE DRAWINGS

The above and other features of the disclosure will become more apparent by describing in further detail embodiments thereof with reference to the accompanying drawings, in which.

DETAILED DESCRIPTION

Figure 1:
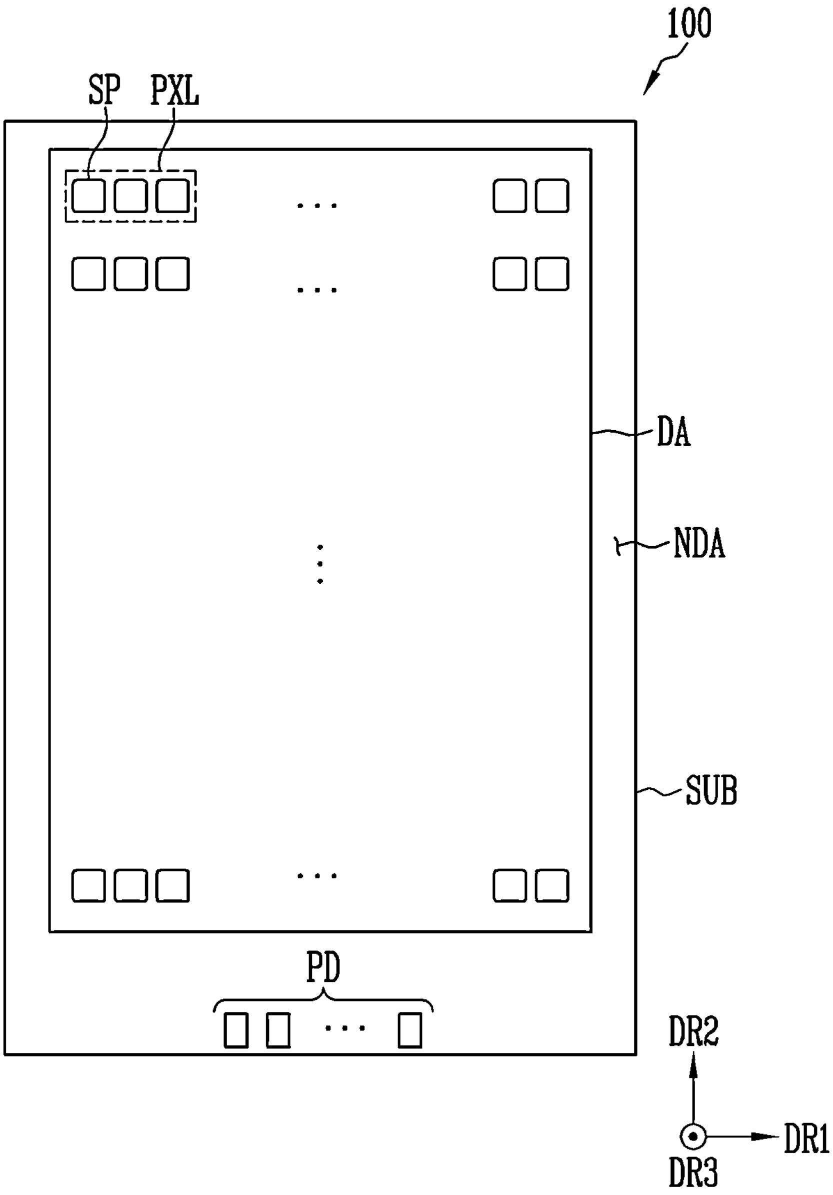
FIG. 1 is a schematic plan view illustrating a display device according to an embodiment.

The subject matter of the disclosure may be modified in various suitable manners and have various suitable forms. Therefore, example embodiments will be illustrated in the drawings and will be described in more detail in the specification. However, it should be understood that the disclosure is not intended to be limited to the disclosed forms, and the disclosure includes all modifications, equivalents, and substitutions within the spirit and technical scope of the disclosure.

Terms of "first", "second", and the like may be used to describe various suitable components, but the components should not be limited by these terms. The terms are used only for the purpose of distinguishing one component from another component. For example, without departing from the scope of the disclosure, a first component may be referred to as a second component, and similarly, a second component may also be referred to as a first component. In the following description, singular expressions include plural expressions unless the context clearly dictates otherwise.

It should be understood that in the present disclosure, a term of "include", "have", or the like is used to specify that there is a feature, a number, a step, an operation, a component, a part, or a combination thereof described in the specification, but does not exclude a possibility of the presence or addition of one or more other features, numbers, steps, operations, components, parts, or combinations thereof in advance. In addition, a case where a portion of a layer, a layer, an area, a plate, or the like is referred to as being "on" another portion, it includes not only a case where the portion is "directly on" another portion, but also a case where there is further another portion between the portion and another portion. In addition, in the present specification, when a portion of a layer, a layer, an area, a plate, or the like is formed on another portion, a forming direction is not limited to an upper direction but includes forming the portion on a side surface or in a lower direction. On the contrary, when a portion of a layer, a layer, an area, a plate, or the like is formed "under" another portion, this includes not only a case where the portion is "directly beneath" another portion but also a case where there is further another portion between the portion and another portion.

The disclosure relates to a display device. Hereinafter, a display device according to an embodiment is described with reference to the accompanying drawings.

FIG. 1 is a schematic plan view illustrating a display device according to an embodiment.

Referring to FIG. 1, the display device 100 according to an embodiment is configured to emit light.

The display device 100 may include a display area DA and a non-display area NDA. The display device 100 displays an image through the display area DA. The non-display area NDA is provided around the display area DA.

The display device 100 may include a substrate SUB, the sub-pixels SP, and pads PD.

When the display device 100 is used as a display screen of a head mounted display (HMD) device, a virtual reality (VR) device, a mixed reality (MR) device, an augmented reality (AR) device, or the like, the display device 100 may be positioned very close to a user's eyes. In this case, sub-pixels SP of a relatively high integration degree are beneficial. In order to increase an integration degree of the sub-pixels SP, the substrate SUB may be provided as a silicon substrate. The sub-pixels SP may be on the substrate SUB, which is the silicon substrate. The display device 100 including an OLED formed on the substrate SUB, which is the silicon substrate, may be referred to as an OLED on silicon (OLEDoS) display device.

The sub-pixels SP are in the display area DA on the substrate SUB. The sub-pixels SP may be provided in a matrix shape along a first direction DR1 and a second direction DR2 crossing the first direction DR1. However, embodiments are not limited thereto. For example, the sub-pixels SP may be provided in a zigzag shape along the first direction DR1 and the second direction DR2. For example, the sub-pixels SP may be arranged in a PENTILE® arrangement structure (e.g., an RGBG matrix, RGBG structure, or RGBG matrix structure), but the present disclosure is not limited thereto. PENTILE® is a duly registered trademark of Samsung Display Co., Ltd. The first direction DR1 may be a row direction, and the second direction DR2 may be a column direction.

Each of the sub-pixels SP may include at least one light emitting element LD (refer to FIG. 6) configured to generate light. Accordingly, each of the sub-pixels SP may generate light of a set or specific color, such as red, green, blue, cyan, magenta, or yellow. Two or more sub-pixels SP among the sub-pixels SP may provide a pixel PXL. For example, as shown in FIG. 1, three sub-pixels SP may provide a pixel PXL.

Hereinafter, the subject matter of the disclosure is described based on an embodiment in which the sub-pixels SP include a first sub-pixel SP1 that provides light of a first color (for example, red), a second sub-pixel SP2 that provides light of a second color (for example, green), and a third sub-pixel SP3 that provides light of a third color (for example, blue).

According to an embodiment, the first sub-pixel SP1 may be a red pixel and may provide light having a wavelength band of 600 nm to 750 nm. The second sub-pixel SP2 may be a green pixel and may provide light having a wavelength band of 480 nm to 560 nm. The third sub-pixel SP3 may be a blue pixel and may provide light having a wavelength band of 370 nm to 460 nm.

A component for controlling the sub-pixels SP may be in the non-display area NDA on the substrate SUB. For example, lines connected to the sub-pixels SP (for example, gate lines, data lines, and/or the like for driving the sub-pixels SP) may be in the non-display area NDA. In embodiments, a gate driver, a data driver, a voltage generator, a controller, a temperature sensor, and/or the like that obtain driving signals supplied to the sub-pixels SP may be integrated into the non-display area NDA of the display device. However, the disclosure is not limited thereto.

Pads PD are in the non-display area NDA on the substrate SUB. The pads PD may be electrically connected to the sub-pixels SP through lines. For example, the pads PD may be connected to the sub-pixels SP through data lines.

The pads PD may interface components in the display area DA and the non-display area NDA with other components of the display device 100. In embodiments, voltages and signals useful for an operation of the components included in the display device 100 may be provided from a driver integrated circuit through the pads PD. For example, the data lines may be electrically connected to the driver integrated circuit through the pads PD. For example, power voltages for driving the sub-pixels SP may be received from the driver integrated circuit through the pads PD. For example, a gate control signal that controls the gate driver may be transmitted from the driver integrated circuit to the gate driver through the pads PD.

In embodiments, a circuit board may be electrically connected to the pads PD using a conductive adhesive member (e.g., an electrically conductive adhesive member) such as an anisotropic conductive film. In embodiments, the circuit board may be a flexible circuit board (FPCB) and/or a flexible film having a flexible material. The driver integrated circuit may be mounted on the circuit board to be electrically connected to the pads PD.

In embodiments, the display area DA may have various suitable shapes. The display area DA may have a closed loop shape including straight and/or curved sides. For example, the display area DA may have shapes such as a polygon, a circle, a semicircle, and/or an ellipse.

In embodiments, the display device 100 may have a flat display surface. In embodiments, the display device 100 may have a display surface that is at least partially round. In embodiments, the display device 100 may be bendable, foldable, and/or rollable. In embodiments, the display device 100 and/or the substrate SUB may include materials having a flexible property.

Figure 2:
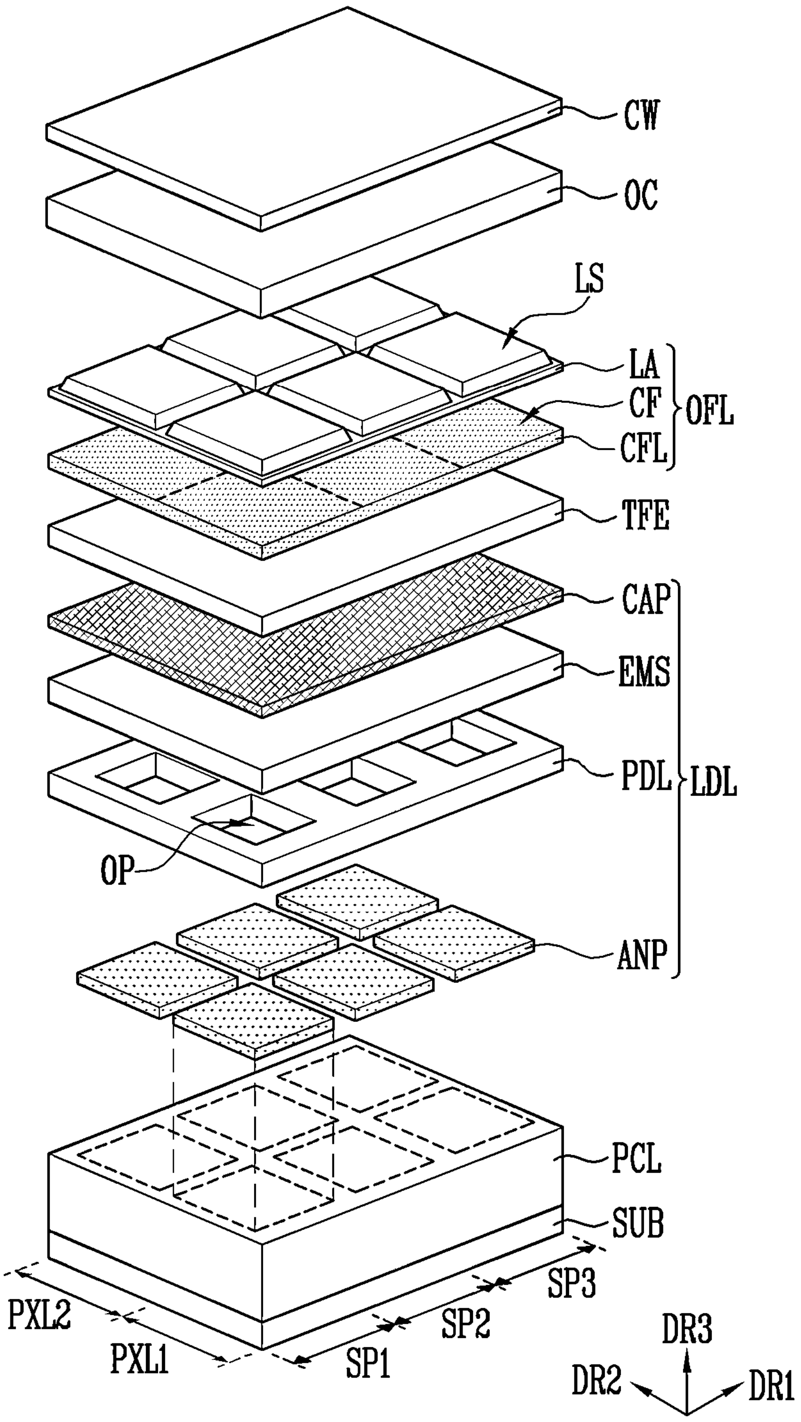
FIG. 2 is an exploded perspective view illustrating a portion of the display device of FIG. 1.

FIG. 2 is an exploded perspective view illustrating a portion of the display device of FIG. 1. In FIG. 2, for clear and concise description, a portion of the display device 100 corresponding to two pixels PXL1 and PXL2 among the pixels PXL of FIG. 1 is schematically shown. A portion of the display device 100 corresponding to remaining pixels may be similarly configured.

Referring to FIGS. 1-2, each of the first and second pixels PXL1 and PXL2 may include first to third sub-pixels SP1, SP2, and SP3. However, embodiments are not limited thereto. For example, each of the first and second pixels PXL1 and PXL2 may include four sub-pixels or two sub-pixels.

In FIG. 2, the first to third sub-pixels SP1, SP2, and SP3 have quadrangle shapes when viewed from a third direction DR3 crossing the first and second directions DR1 and DR2, and have sizes equal to each other. However, embodiments are not limited thereto. The first to third sub-pixels SP1, SP2, and SP3 may be modified to have various suitable shapes.

The display device 100 may include the substrate SUB, a pixel-circuit layer PCL, a light emitting element layer LDL, an encapsulation layer TFE, an optical functional layer OFL, an overcoat layer OC, and a cover window CW.

In embodiments, the substrate SUB may include a silicon wafer substrate formed using a semiconductor process. The substrate SUB may include a semiconductor material suitable to provide circuit elements. For example, the semiconductor material may include silicon, germanium, and/or silicon-germanium. The substrate SUB may be provided from a bulk wafer, an epitaxial layer, a silicon on insulator (SOI) layer, a semiconductor on insulator (SeOI) layer, and/or the like. In embodiments, the substrate SUB may include a glass substrate. In embodiments, the substrate SUB may include a polyimide (PI) substrate.

The pixel-circuit layer PCL is on the substrate SUB. The substrate SUB and/or the pixel-circuit layer PCL may include insulating layers (e.g., electrically insulating layers) and conductive patterns (e.g., electrically conductive patterns) between the insulating layers. The conductive patterns of the pixel-circuit layer PCL may function as at least a portion of circuit elements, lines, and/or the like. The conductive patterns may include copper, but embodiments are not limited thereto.

The circuit elements may include the sub-pixel circuit SPC for each of the first to third sub-pixels SP1, SP2, and SP3. The sub-pixel circuit SPC may include transistors and one or more capacitors. Each transistor may include a semiconductor portion including a source area, a drain area, and a channel area, and a gate electrode overlapping the semiconductor portion. In embodiments, when the substrate SUB is provided as a silicon substrate, the semiconductor portion may be included in the substrate SUB, and the gate electrode may be included in the pixel-circuit layer PCL as a conductive pattern (e.g., an electrically conductive pattern) of the pixel-circuit layer PCL. In embodiments, when the substrate SUB is provided as a glass substrate and/or a PI substrate, the semiconductor portion and the gate electrode may be included in the pixel-circuit layer PCL. Each capacitor may include electrodes spaced apart from each other. For example, each capacitor may include electrodes spaced apart from each other on a plane defined by the first and second directions DR1 and DR2. For example, each capacitor may include electrodes spaced apart from each other in the third direction DR3 with an insulating layer (e.g., an electrically insulating layer) therebetween.

The lines of the pixel-circuit layer PCL may include signal lines connected to each of the first to third sub-pixels SP1, SP2, and SP3, for example, a gate line, an emission control line, a data line, and/or the like.

The light emitting element layer LDL may include an anode electrode portion ANP, a pixel defining layer PDL, a light emitting structure EMS, and/or a cathode electrode portion CAP.

The anode electrode portion ANP may be on the pixel-circuit layer PCL. The anode electrode portion ANP may include anode electrodes corresponding to the respective sub-pixels SP. The anode electrode portion ANP may contact the circuit elements of the pixel-circuit layer PCL.

The pixel defining layer PDL is on the anode electrode portion ANP. The pixel defining layer PDL may include an opening OP the exposes a portion of each of the anode electrode portion ANP. The opening OP of the pixel defining layer PDL may be understood as emission areas corresponding to the first to third sub-pixels SP1 to SP3, respectively.

In embodiments, the pixel defining layer PDL may include an inorganic material. In embodiments, the pixel defining layer PDL may include a plurality of stacked inorganic layers. For example, the pixel defining layer PDL may include silicon oxide (SixOy) and/or silicon nitride (SixNy). In embodiments, the pixel defining layer PDL may include an organic material. However, a material of the pixel defining layer PDL is not limited thereto.

The pixel defining layer PDL may have various suitable structures and may form a separating structure. A detailed content regarding the separating structure is further described below.

The light emitting structure EMS may be on the anode electrode portion ANP exposed by the opening OP of the pixel defining layer PDL. The light emitting structure EMS may include a light emitting layer EML (refer to FIG. 6) configured to generate light, an electron transport part ETU (refer to FIG. 6) configured to transport an electron, a hole transport part HTU (refer to FIG. 6) configured to transport a hole, and/or the like.

In embodiments, the light emitting structure EMS may fill the opening OP of the pixel defining layer PDL, and may be entirely on the pixel defining layer PDL. In embodiments, the light emitting structure EMS may extend across the first to third sub-pixels SP1 to SP3. In embodiments, at least a portion of layers in the light emitting structure EMS may be disconnected or bent at boundaries between the first to third sub-pixels SP1 to SP3. However, embodiments are not limited thereto. For example, portions of the light emitting structure EMS corresponding to the first to third sub-pixels SP1 to SP3 may be separated from each other, and each of the portions may be in the opening OP of the pixel defining layer PDL.

The cathode electrode portion CAP may be on the light emitting structure EMS. The cathode electrode portion CAP may extend across the first to third sub-pixels SP1 to SP3. As described above, the cathode electrode portion CAP may be provided as a common electrode for the first to third sub-pixels SP1 to SP3.

The cathode electrode portion CAP may be configured to transmit light emitted from the light emitting structure EMS. For example, the cathode electrode portion CAP may include a thin metal layer.

According to an embodiment, the cathode electrode portion CAP may include a multi-metal structure. For example, the cathode electrode portion CAP may include a first cathode electrode CE1 (refer to FIG. 9) and a second cathode electrode CE2 (refer to FIG. 9). A more detailed description regarding this is provided below with reference to the drawings after FIG. 6.

It may be understood that any one selected from the anode electrode portion ANP, a portion of the light emitting structure EMS overlapping it, and a portion of the cathode electrode portion CAP overlapping it may be included in a light emitting element LD. In embodiments, each of the light emitting elements LD of the first to third sub-pixels SP1 to SP3 may include one anode electrode, a portion of the light emitting structure EMS overlapping it, and a portion of the cathode electrode portion CAP overlapping it.

In each of the first to third sub-pixels SP1 to SP3, holes injected from the anode electrode portion ANP and electrons injected from the cathode electrode portion CAP may be transported into the light emitting layer EML of the light emitting structure EMS to form excitons, and when the excitons transits from an excited state to a ground state, light may be generated. A luminance of light may be determined according to an amount of a current flowing through the light emitting layer EML. According to a configuration of the light emitting layer EML, a wavelength range of the generated light may be determined or controlled.

The encapsulation layer TFE is on the cathode electrode portion CAP. The encapsulation layer TFE may cover the light emitting element layer LDL and/or the pixel-circuit layer PCL. The encapsulation layer TFE may be configured to prevent or reduce permeation of oxygen, moisture, and/or the like to the light emitting element layer LDL. In embodiments, the encapsulation layer TFE may include a structure in which one or more inorganic layers and one or more organic layers are alternately stacked. For example, the inorganic layer may include silicon nitride, silicon oxide, silicon oxynitride (SixOyNz), and/or the like. For example, the organic layer may include an organic insulating material (e.g., an organic electrically insulating material) such as acrylic resin, epoxy resin, phenol resin, polyamide resin, polyimide resin, unsaturated polyester resin, polyphenylenether resin, polyphenylenesulfide resin, and/or benzocyclobutene (BCB). However, materials of the organic and the inorganic layers of the encapsulation layer TFE are not limited thereto.

In order to improve an encapsulation efficiency of the encapsulation layer TFE, the encapsulation layer TFE may further include a thin film including aluminum oxide (AlOx). The thin film including the aluminum oxide may be on an upper surface of the encapsulation layer TFE facing the optical functional layer OFL and/or a lower surface of the encapsulation layer TFE facing the light emitting element layer LDL.

The thin film including the aluminum oxide may be formed through atomic layer deposition (ALD) method. However, embodiments are not limited thereto. The encapsulation layer TFE may further include a thin film including at least one selected from various materials suitable for improving the encapsulation efficiency.

The optical functional layer OFL is on the encapsulation layer TFE. The optical functional layer OFL may include a color filter layer CFL and a lens array LA.

The color filter layer CFL is between the encapsulation layer TFE and the lens array LA. The color filter layer CFL is configured to filter the light emitted from the light emitting structure EMS and selectively output light having a wavelength range and/or a color corresponding to each sub-pixel. The color filter layer CFL may include color filters CF respectively corresponding to the first to third sub-pixels SP1 to SP3, and each of the color filters CF may pass light having a wavelength range corresponding to the corresponding sub-pixel. For example, the color filter corresponding to the first sub-pixel SP1 may pass red color light, the color filter corresponding to the second sub-pixel SP2 may pass green color light, and the color filter corresponding to the third sub-pixel SP3 may pass blue color light. According to the light emitted from the light emitting structure EMS of each sub-pixel, at least a portion of the color filters CF may be omitted.

The lens array LA is on the color filter layer CFL. The lens array LA may include lenses LS respectively corresponding to the first to third sub-pixels SP1 to SP3. Each of the lenses LS may improve light output efficiency by outputting the light emitted from the light emitting structure EMS to a set or intended path. The lens array LA may have a relatively high refractive index. For example, the lens array LA may have a refractive index higher than that of the overcoat layer OC. In embodiments, the lenses LS may include an organic material. In embodiments, the lenses LS may include an acrylic material. However, a material of the lenses LS is not limited thereto.

In embodiments, compared to the opening OP of the pixel defining layer PDL, at least a portion of the color filters CF of the color filter layer CFL and at least a portion of the lenses LS of the lens array LA may be shifted in a direction parallel to the plane defined by the first and second directions DR1 and DR2. In embodiments, in a central area of the display area DA, a center of the color filter CF and a center of the lens LS may be aligned with and/or overlap with a center of the opening OP of the corresponding pixel defining layer PDL when viewed in the third direction DR3. For example, in the central area of the display area DA, the opening OP of the pixel defining layer PDL may completely overlap the corresponding color filter CF of the color filter layer CFL and the corresponding lens LS of the lens array LA. In an area adjacent to the non-display area NDA in the display area DA, the center of the color filter CF and the center of the lens LS may be shifted in a plane direction from the center of the opening OP of the corresponding pixel defining layer PDL when viewed in the third direction DR3. For example, in the area adjacent to the non-display area NDA in the display area DA, the opening OP of the pixel defining layer PDL may partially overlap the corresponding color filter CF of the color filter layer CFL and the corresponding lens LS of the lens array LA. Accordingly, at a center of the display area DA, the light emitted from the light emitting structure EMS may be efficiently output in a normal direction of a display surface. At a periphery or outskirt of the display area DA, the light emitted from the light emitting structure EMS may be efficiently output in a direction inclined by a set or predetermined angle with respect to the normal direction of the display surface.

The overcoat layer OC may be on the lens array LA. The overcoat layer OC may cover the optical functional layer OFL, the encapsulation layer TFE, the light emitting structure EMS, and/or the pixel-circuit layer PCL. The overcoat layer OC may include various materials suitable for protecting layers thereunder from a foreign substance such as dust and/or moisture. For example, the overcoat layer OC may include at least one selected from an inorganic insulating layer (e.g., an inorganic electrically insulating layer) and an organic insulating layer (e.g., an organic electrically insulating layer). For example, the overcoat layer OC may include epoxy, but embodiments are not limited thereto. The overcoat layer OC may have a refractive index lower than that of the lens array LA.

The cover window CW may be on the overcoat layer OC. The cover window CW is configured to protect layers thereunder. The cover window CW may have a refractive index higher than that of the overcoat layer OC. The cover window CW may include glass, but embodiments are not limited thereto. For example, the cover window CW may be an encapsulation glass configured to protect components thereunder. In embodiments, the cover window CW may be omitted.

Figure 3:
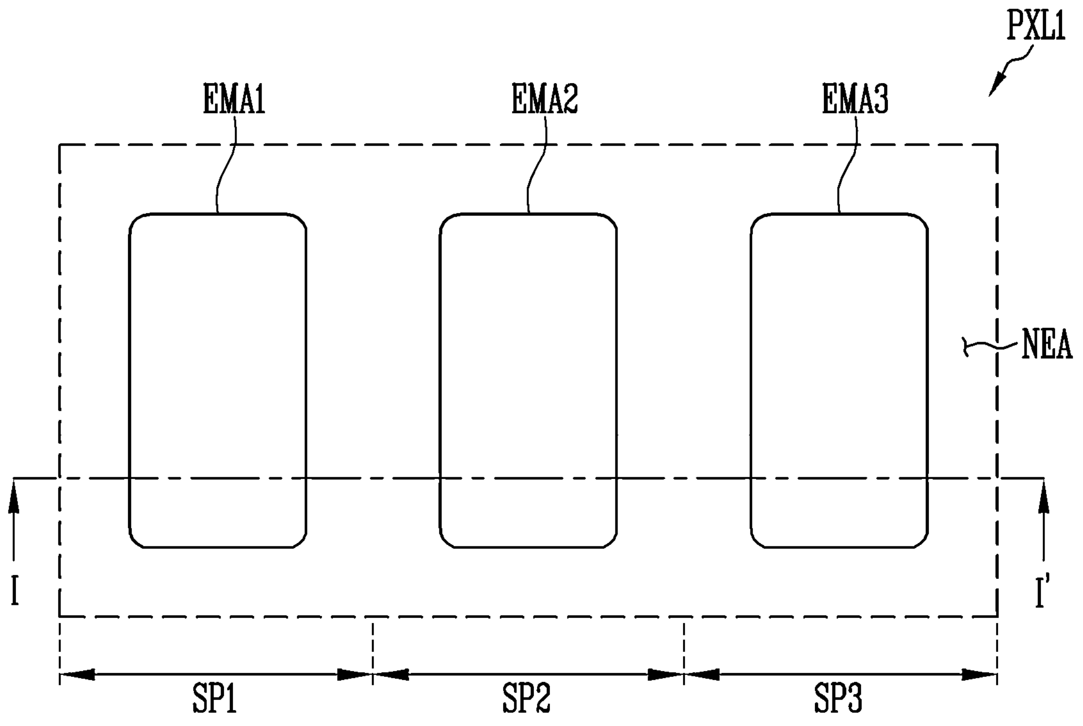
FIG. 3 is a plan view illustrating an embodiment of one of pixels of FIG. 2.

FIG. 3 is a plan view illustrating an embodiment of one of the pixels of FIG. 2. In FIG. 3, the first pixel PXL1 among the first pixel PXL1 and the second pixel PXL2 of FIG. 2 is schematically shown for clear and concise description. The remaining pixels may be configured similarly to the first pixel PXL1.

Referring to FIGS. 2-3, the first pixel PXL1 may include a first sub-pixel SP1, a second sub-pixel SP2, and a third sub-pixel SP3 arranged in the first direction DR1.

The first sub-pixel SP1 may include a first emission area EMA1 and a non-emission area NEA around the first emission area EMA1. The second sub-pixel SP2 may include a second emission area EMA2 and a non-emission area NEA around the second emission area EMA2. The third sub-pixel SP3 may include a third emission area EMA3 and a non-emission area NEA around the third emission area EMA3.

Figure 11:
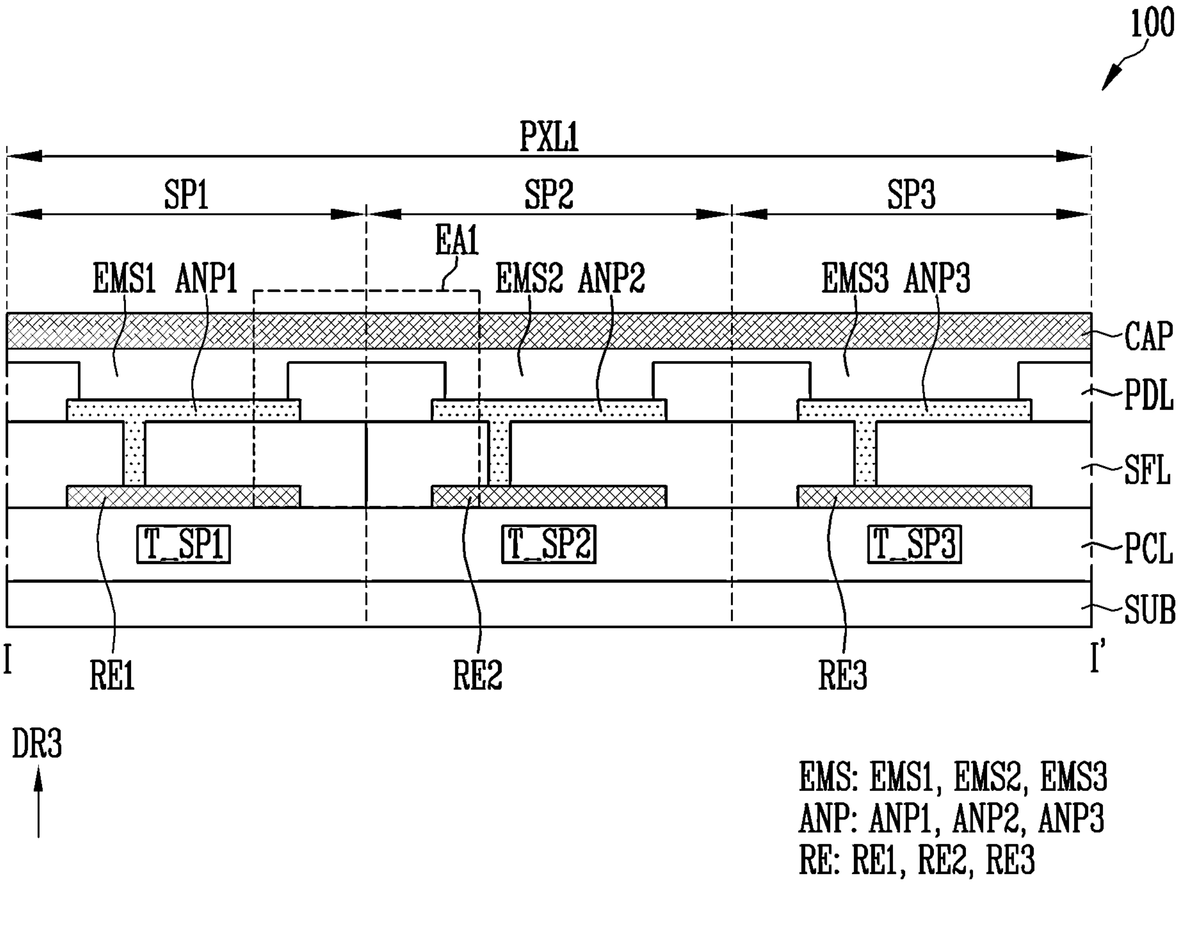
FIGS. 11-14 are schematic cross-sectional views illustrating a display device according to an embodiment.
Figure 12:
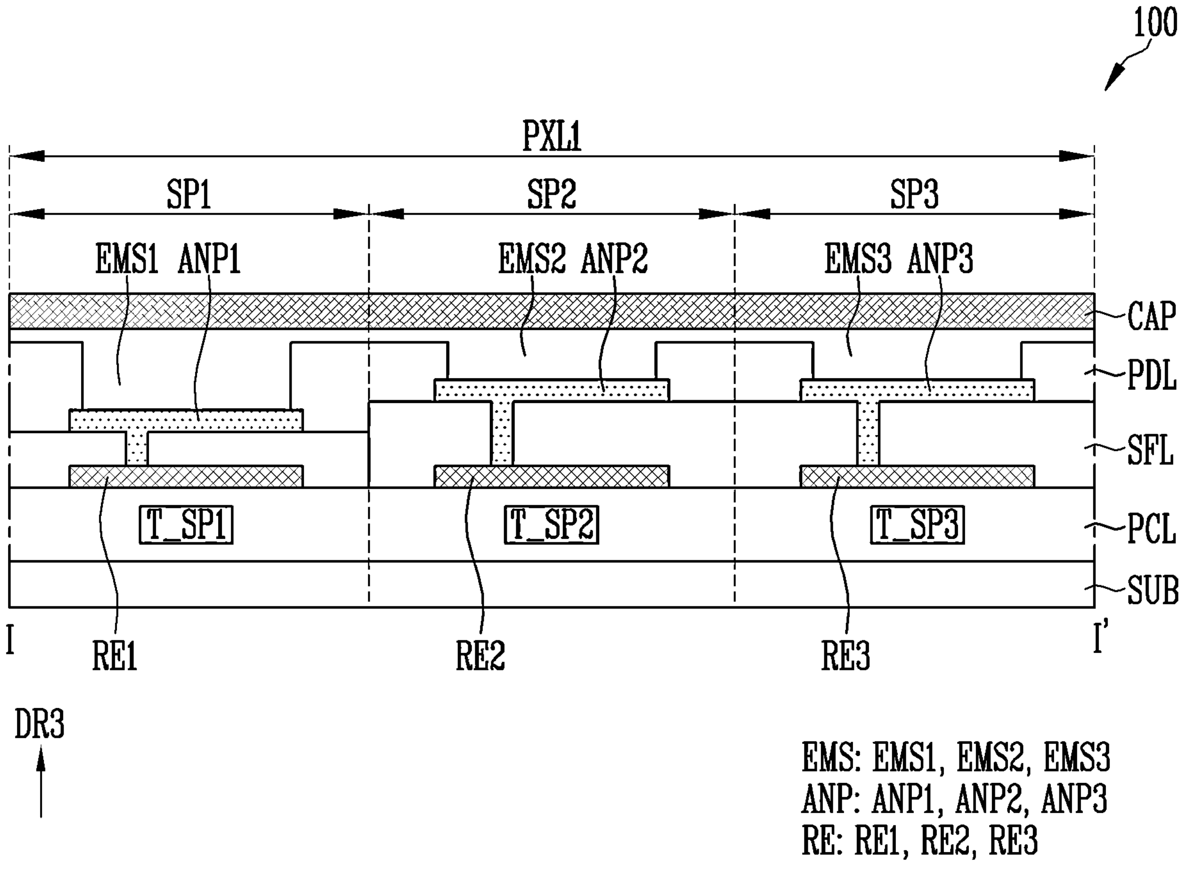
Figure 13:
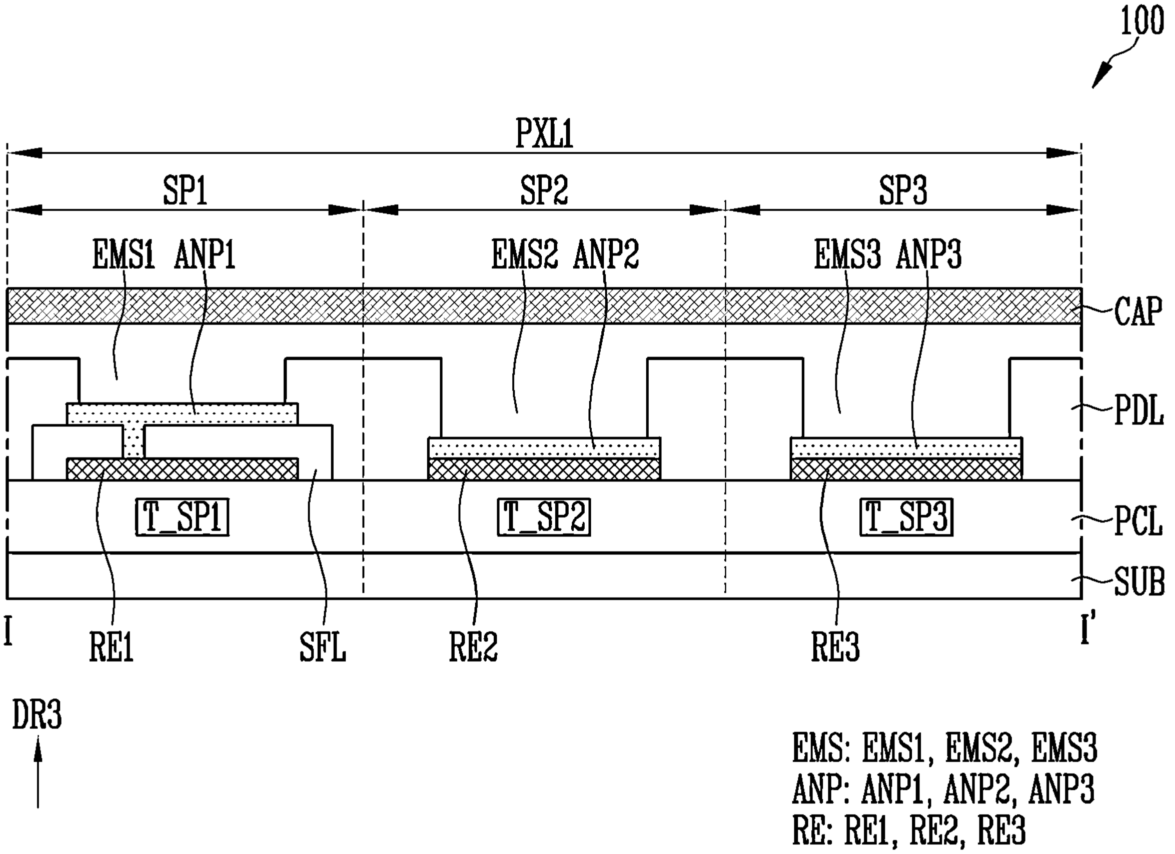
Figure 14:
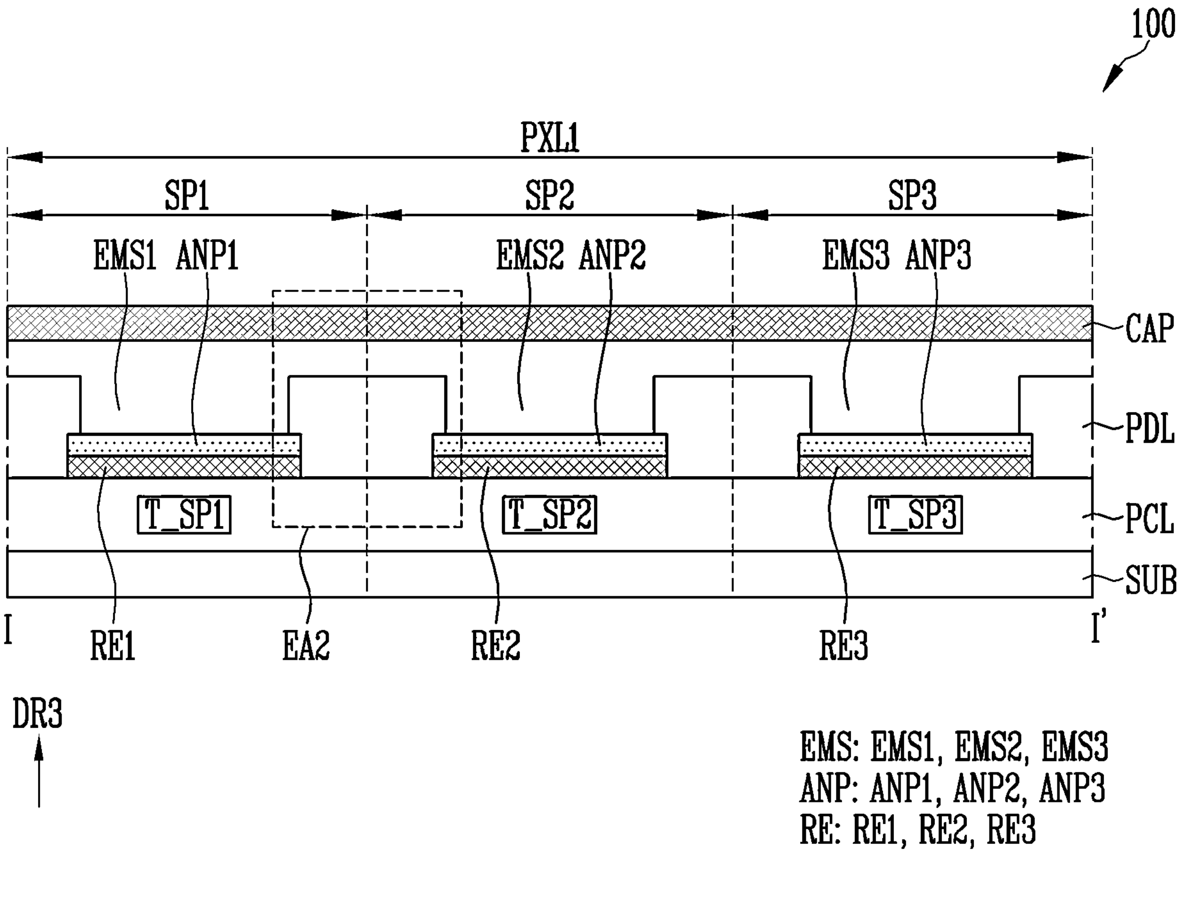

The first emission area EMA1 may be an area where light is emitted from a portion of the light emitting structure EMS corresponding to the first sub-pixel SP1 (for example, a first light emitting structure EMS1 (FIG. 11)). The second emission area EMA2 may be an area where light is emitted from a portion of the light emitting structure EMS corresponding to the second sub-pixel SP2 (for example, a second light emitting structure EMS2 (FIG. 11)). The third emission area EMA3 may be an area where light is emitted from a portion of the light emitting structure EMS corresponding to the third sub-pixel SP3 (for example, a third light emitting structure EMS3 (FIG. 11)). As described with reference to FIG. 2, each emission area may be understood as the opening OP of the pixel defining layer PDL corresponding to each of the first sub-pixel SP1, the second sub-pixel SP2, and the third sub-pixel SP3.

Figure 4:
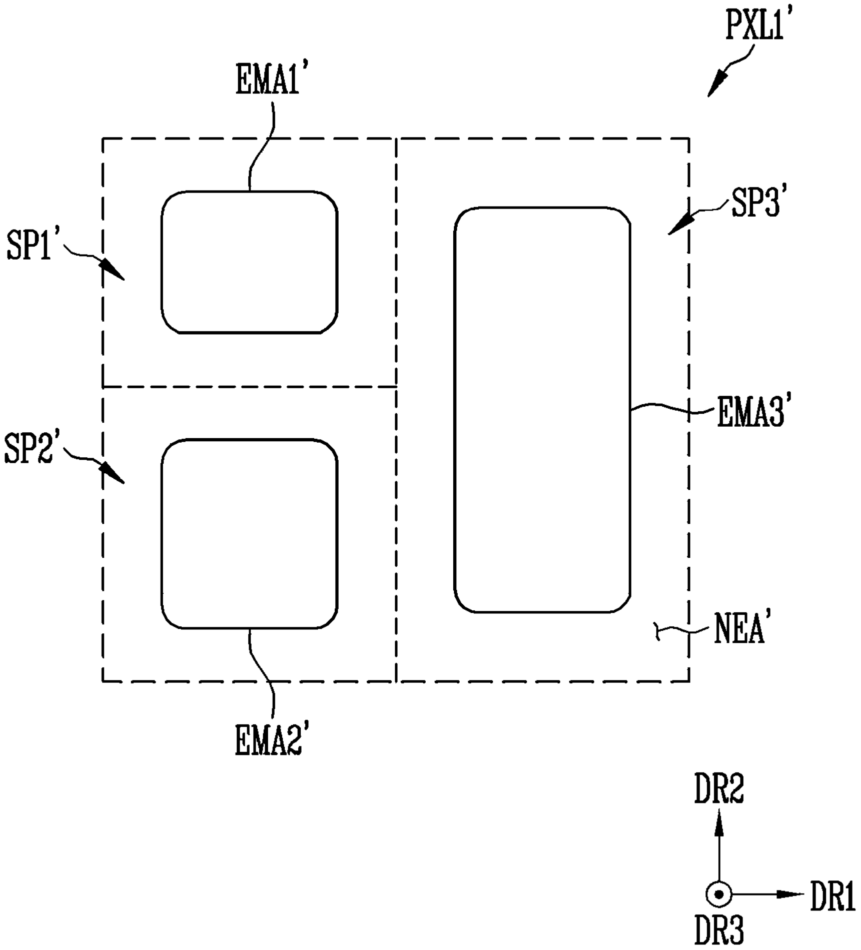
FIG. 4 is a plan view illustrating an embodiment of one of the pixels of FIG. 2.

FIG. 4 is a plan view illustrating an embodiment of one of the pixels of FIG. 2.

Referring to FIG. 4, a first pixel PXL1' may include first to third sub-pixels SP1' to SP3'.

The first sub-pixel SP1' may include a first emission area EMA1' and a non-emission area NEA' around the first emission area EMA1'. The second sub-pixel SP2' may include a second emission area EMA2' and a non-emission area NEA' around the second emission area EMA2'. The third sub-pixel SP3' may include a third emission area EMA3' and a non-emission area NEA' around the third emission area EMA3'.

The first sub-pixel SP1' and the second sub-pixel SP2' may be arranged in the second direction DR2. The third sub-pixel SP3' may be arranged in the first direction DR1 with respect to each of the first and second sub-pixels SP1' and SP2'.

The second sub-pixel SP2' may have an area greater than that of the first sub-pixel SP1', and the third sub-pixel SP3' may have an area greater than that of the second sub-pixel SP2'. Accordingly, the second emission area EMA2' may have an area greater than the first emission area EMA1', and the third emission area EMA3' may have an area greater than that of the second emission area EMA2'. However, embodiments are not limited thereto. For example, the first and second sub-pixels SP1' and SP2' may have substantially the same area, and the third sub-pixel SP3' may have an area greater than that of each of the first and second sub-pixels SP1' and SP2'. As described above, the areas of the first to third sub-pixels SP1' to SP3' may suitably vary according to embodiments.

Figure 5:
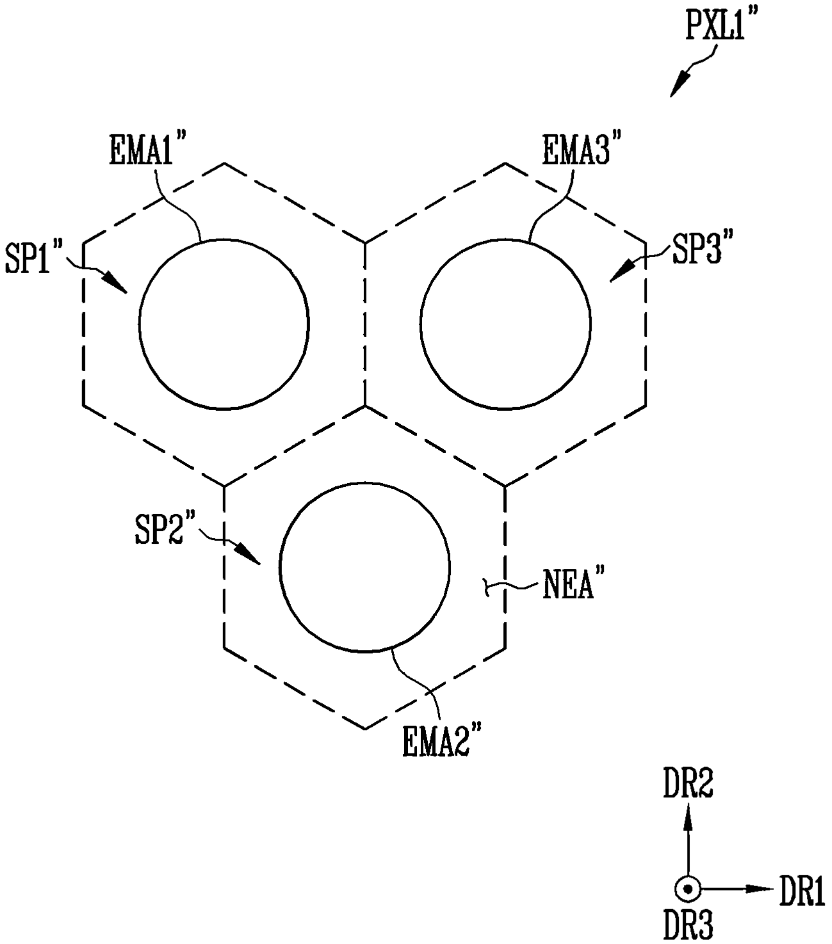
FIG. 5 is a plan view illustrating an embodiment of one of the pixels of FIG. 2.

FIG. 5 is a plan view illustrating an embodiment of one of the pixels of FIG. 2.

Referring to FIG. 5, a first sub-pixel SP1" may include a first emission area EMA1" and a non-emission area NEA" around the first emission area EMA1". A second sub-pixel SP2" may include a second emission area EMA2" and a non-emission area NEA" around the second emission area EMA2". A third sub-pixel SP3" may include a third emission area EMA3" and a non-emission area NEA" around the third emission area EMA3".

The first to third sub-pixels SP1" to SP3" may have polygonal shapes when viewed in the third direction DR3. For example, shapes of the first to third sub-pixels SP1" to SP3" may be hexagonal shapes as shown in FIG. 2.

The first to third emission areas EMA1" to EMA3" may have circular shapes when viewed in the third direction DR3. However, embodiments are not limited thereto. For example, each of the first to third emission areas EMA1" to EMA3" may have a polygonal shape.

The first and third sub-pixels SP1" and SP3" may be arranged in the first direction DR1. The second sub-pixel SP2" may be provided in a direction inclined by an acute angle based on the second direction DR2 (or a diagonal direction) with respect to the first sub-pixel SP1".

The arrangements of the sub-pixels shown in FIGS. 3-5 are examples, and embodiments are not limited thereto. Each pixel PXL may include two or more sub-pixels SP, the sub-pixels SP may be arranged in various methods, the respective sub-pixels SP may have various suitable shapes, and respective emission areas EMA1, EMA2, and EMA3 thereof may also have various suitable shapes.

Hereinafter, with reference to FIGS. 6-18, the display device 100 including the cathode electrode portion CAP according to an embodiment is described. A content that may overlap the content described above is briefly described or is not repeated.

Figure 6:
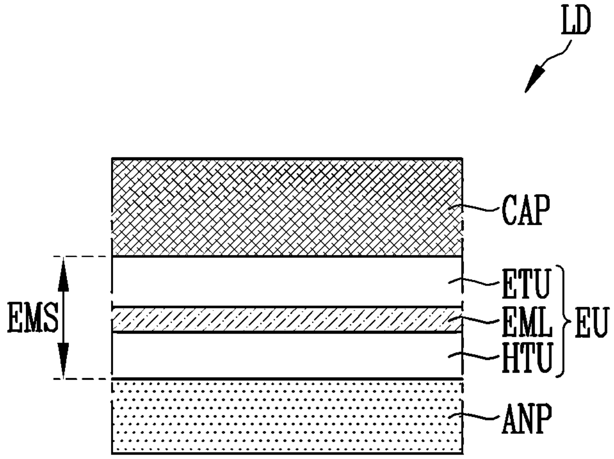
FIGS. 6-8 are schematic cross-sectional views illustrating a light emitting element according to an embodiment.
Figure 7:
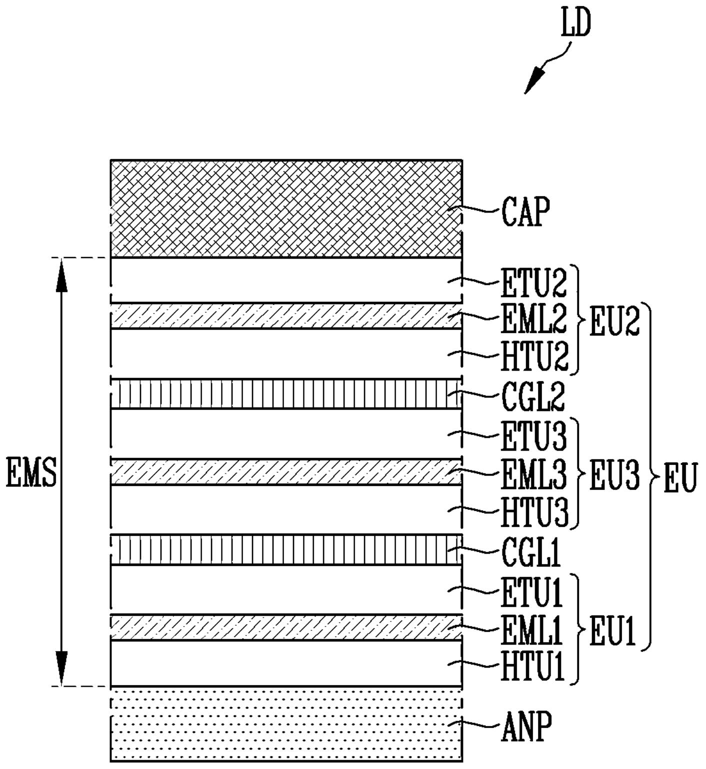
Figure 8:
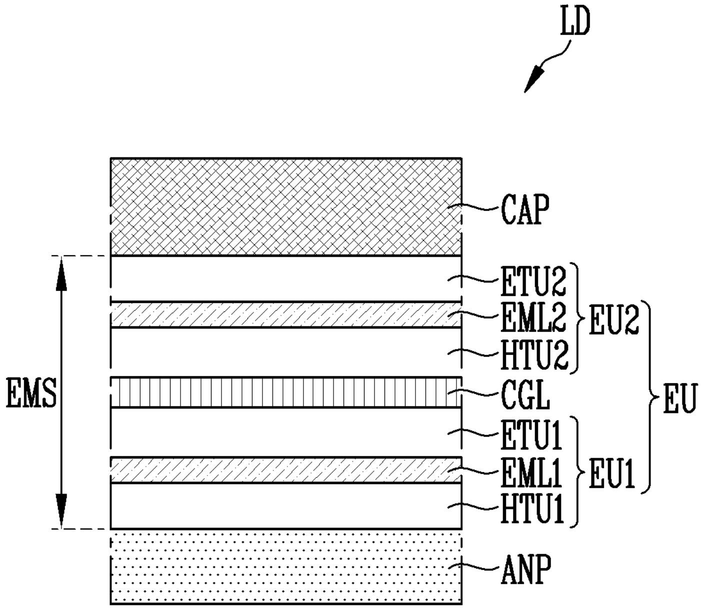

FIGS. 6-8 are schematic cross-sectional views illustrating a light emitting element according to an embodiment. FIG. 6 may illustrate a cross-sectional structure of a light emitting element LD according to an embodiment, and FIGS. 7-8 may illustrate a cross-sectional structure of a light emitting element LD including a tandem structure according to an embodiment. For example, FIG. 7 may schematically show a light emitting element LD including a tandem structure including three light emitting parts EU, and FIG. 8 may schematically show a light emitting element LD including a tandem structure including two light emitting parts EU.

Referring to FIGS. 6-8, the light emitting element LD may include the anode electrode portion ANP, the light emitting structure EMS, and the cathode electrode portion CAP.

The anode electrode portion ANP may be electrically connected to the light emitting structure EMS and may supply a hole to the light emitting structure EMS.

The anode electrode portion ANP may include various suitable conductive materials (e.g., electrically conductive materials). For example, the anode electrode portion ANP may include a transparent conductive material (e.g., a transparent electrically conductive material). For example, the anode electrode portion ANP may include at least one selected from transparent conductive materials such as indium tin oxide (ITO), indium zinc oxide (IZO), zinc oxide (ZnOx), indium gallium zinc oxide (IGZO), and indium tin zinc oxide (ITZO). However, the disclosure is not limited thereto. The anode electrode portion ANP may include an opaque conductive material (e.g., an opaque electrically conductive material) that may reflect light. For example, the anode electrode portion ANP may include one or more selected from titanium nitride (TiN), silver (Ag), and aluminum (Al).

For example, the anode electrode portion ANP may include a structure in which ITO/Ag is on TiN/Ag. According to an embodiment, the anode electrode portion ANP may include a conductive layer structure (e.g., an electrically conductive structure) in which Al/TiN is included and ITO/Ag is not included. However, the disclosure is not limited thereto.

The light emitting structure EMS may be between the anode electrode portion ANP and the cathode electrode portion CAP. The light emitting structure EMS may include a multilayer structure. For example, the light emitting structure EMS may include a light emitting part EU including a hole transport part HTU, a light emitting layer EML (or a light generation layer), and an electron transport part ETU.

In embodiments, the light emitting structure EMS may be formed through a method such as vacuum deposition, spin coating, inkjet printing, and/or the like, but embodiments are not limited thereto.

The light emitting structure EMS may include various suitable organic materials, and according to an embodiment, the light emitting structure EMS may further include a metal-containing compound, an inorganic material such as a quantum dot, and/or the like.

The hole transport part HTU may include a multilayer structure having a plurality of layers respectively including different materials. As an example, the hole transport part HTU may include at least one selected from a hole injection layer and a hole transport layer, and according to an embodiment, the hole transport part HTU may further include a light emitting auxiliary layer, an electron blocking layer, and/or the like.

The hole injection layer may be a layer that performs and/or improves a hole injection function from the anode electrode portion ANP to another adjacent organic layer. The hole transport layer may be a layer that provides a provided hole to the light emitting layer EML. The light emitting auxiliary layer may be a layer that compensates for a resonance distance based on a wavelength of light provided by the light emitting layer EML. The electron blocking layer may be a layer that prevents or reduces injection of an electron from the electron transport part ETU and thus reduces the number of carriers (for example, holes or electrons) leaving the light emitting layer EML.

For example, the hole transport part HTU may have a multiplayer structure such as hole injection layer/hole transport layer, hole injection layer/hole transport layer/light emitting auxiliary layer, hole injection layer/light emitting auxiliary layer, hole transport layer/light emitting auxiliary layer, electron blocking layer/hole injection layer/hole transport layer, hole transport layers disposed sequentially and including different materials, or hole injection layer/hole transport layer/electron blocking layer. However, the disclosure is not limited thereto.

According to an embodiment, the hole transport part HTU may include various suitable organic hole transport materials. For example, the hole transport part HTU may include one or more selected from HAT-CN (Formula 1), HTL1 (Formula 2), HTL2 (Formula 3), HTL3 (Formula 4), HTL4 (Formula 5), and TAPC (Formula 6). According to an embodiment, the hole transport part HTU may include a stack structure including HAT-CN as a hole injection layer, one selected from HTL1 to HTL4 as a hole transport layer, and TAPC as an light emitting auxiliary layer.

Formula 1

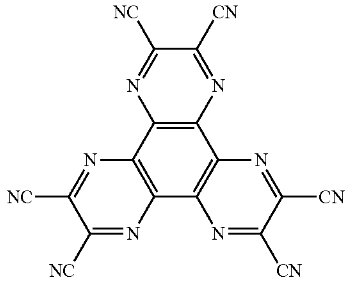

Formula 2

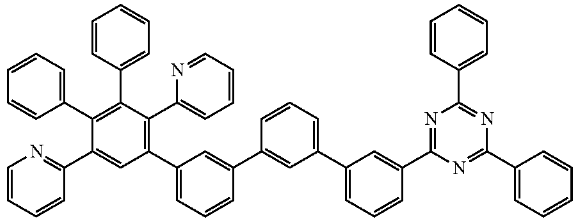

Formula 3

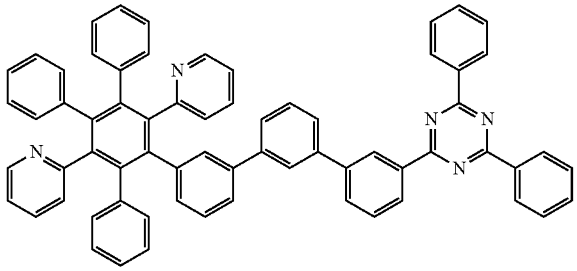

Formula 4

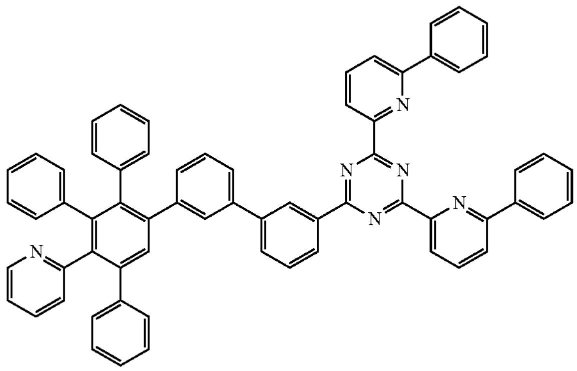

-continued

Formula 5

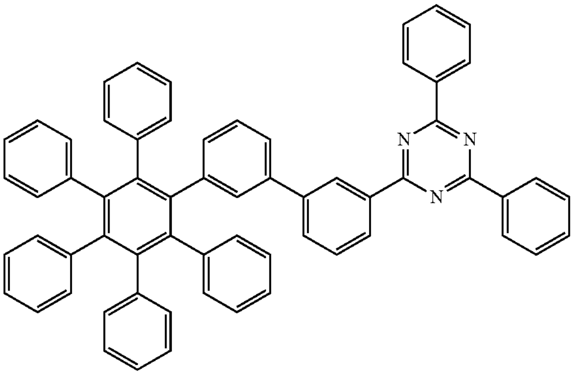

Formula 6

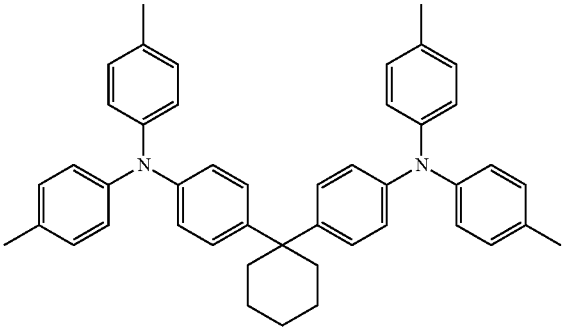

However, the disclosure is not limited thereto. According to an embodiment, the hole transport part HTU may include any suitable spin-coated polymer and/or the like, and may further include a p-dopant.

The light emitting layer EML may include a material that may emit light of one color. The light emitting layer EML may include a host and a dopant. The host of the light emitting layer EML may be a light emitting material that may capture carriers (electrons and holes) for light generation, and may induce excitons to be generated efficiently. The dopant may include a phosphorescent dopant or a fluorescent dopant. According to an embodiment, the dopant may include an organic material, and may include a metal complex and/or the like. For example, the dopant may include TBP (Formula 7). However, an example of the dopant is not particularly limited.

Formula 7

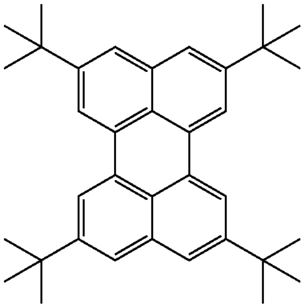

The electron transport part ETU may include a multilayer structure having a plurality of layers respectively including different materials. The electron transport part ETU may include at least one selected from an electron injection layer and an electron transport layer, and according to an embodiment, the electron transport part ETU may further include an electron buffer layer, a hole blocking layer, and/or the like.

The electron injection layer may be a layer that performs and/or improves an electron injection function from the cathode electrode portion CAP to another adjacent organic layer. The electron transport layer may be a layer that provides a provided electron to the light emitting layer EML. The hole blocking layer may be a layer that prevents or reduces injection of a hole from the hole transport part HTU and thus reduces the number of carriers leaving the light emitting layer EML.

For example, the electron transport part ETU may have a multi-layer structure such as electron transport layer/electron injection layer, hole blocking layer/electron transport layer/electron injection layer, electron control layer/electron transport layer/electron injection layer, or buffer layer/electron transport layer/electron injection layer. However, the disclosure is not limited thereto.

According to an embodiment, the electron transport layer among the layers forming the electron transport part ETU may include two or more electron transport layers. According to an embodiment, the electron transport layer may include a first electron transport layer and a second electron transport layer on the first electron transport layer. The first electron transport layer may be adjacent to the anode electrode portion ANP compared to the second electron transport layer, and the second electron transport layer may be adjacent to the cathode electrode portion CAP compared to the first electron transport layer. The first electron transport layer and the second electron transport layer may contact each other. According to an embodiment, the first electron transport layer and the second electron transport layer may include different materials. For example, the first electron transport layer may include a material so that a lowest unoccupied molecular orbital (LUMO) energy level is 2.0 eV or more, and thus an electron injection characteristic of the electron transport part ETU may be further improved. The second electron transport layer may include a material so that a LUMO energy level is 2.0 eV or less. For example, the second electron transport layer may have a molar mass of 550 g/mol or more, and for example, the second electron transport layer may include a triazine-based material. In embodiments, the second electron transport layer may further reduce a disconnection risk of the cathode electrode portion CAP. For example, due to a molecular structure of the second electron transport layer, lower layers where the cathode electrode portion CAP is in a discontinuous area (for example, trenches TR1 and TR2 (refer to FIGS. 15, 16, 19, and 20)) may be formed to be generally flat, and disconnection of the cathode electrode portion CAP may be further prevented or reduced.

According to an embodiment, the electron transport part ETU may have a multi-layer structure such as first electron transport layer/second electron transport layer/electron injection layer, hole blocking layer/first electron transport layer/second electron transport layer/electron injection layer, electron control layer/first electron transport layer/second electron transport layer/electron injection layer, or buffer layer/first electron transport layer/second electron transport layer/electron injection layer. However, the disclosure is not limited thereto.

According to an embodiment, the electron transport part ETU may include various suitable electron transport compounds. For example, the electron transport part ETU may include a metal-free organic material, and/or may include a metal-containing organic material, and/or various suitable metal materials (for example, an alkali earth metal, a rare earth metal, and/or the like).

For example, the electron transport part ETU may include one or more selected from T2T (Formula 8), TPBi (Formula 9), Lithium Quinolide LiQ (Formula 10), Lithium Fluoride LiF, and Yb. According to an embodiment, the electron transport part ETU may include a stack structure including T2T as a hole blocking layer, TPBi and LiQ as an electron transport layer, and LiF as an electron injection layer.

Formula 8

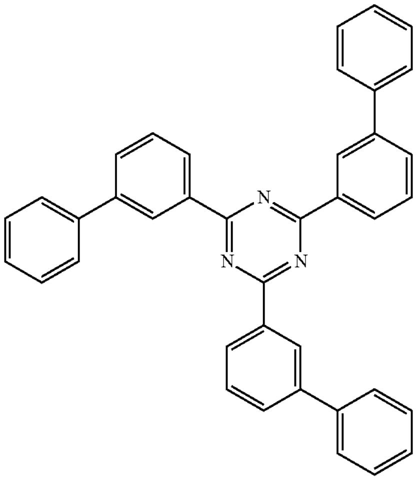

Formula 9

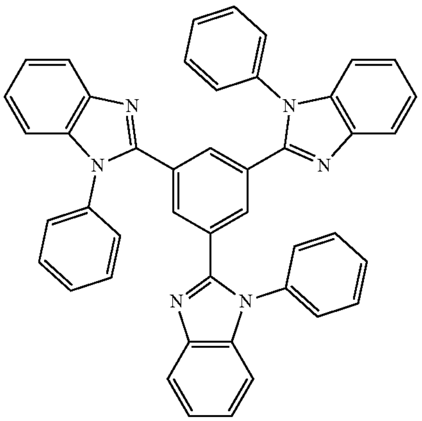

Formula 10

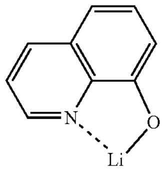

According to an embodiment, referring to FIG. 7, the light emitting structure EMS may include a tandem structure. For example, the light emitting structure EMS may be configured to emit white light. According to an embodiment, the light emitting part EU may include a first light emitting part EU1 configured to emit light of a first color, a second light emitting part EU2 configured to emit light of a second color, and a third light emitting part EU3 configured to emit light of a third color. The first light emitting part EU1 includes a first hole transport part HTU1, a first light emitting layer EML1, and a first electron transport part ETU1. The second light emitting part EU2 includes a second hole transport part HTU2, a second light emitting layer EML2, and a second electron transport part ETU2. The third light emitting part EU3 includes a third hole transport part HTU3, a third light emitting layer EML3, and a third electron transport part ETU3.

According to an embodiment, the first light emitting part EU1, the third light emitting part EU3, and the second light emitting part EU2 may be sequentially on the anode electrode part portion ANP, and charge generation layers CGL1 and CGL2 may be between adjacent light emitting parts EU. For example, the first charge generation layer CGL1 may be between the first light emitting part EU1 and the third light emitting part EU3, and the second charge generation layer CGL2 may be between the third light emitting part EU3 and the second light emitting part EU2.

Each of the first and second charge generation layers CGL1 and CGL2 may have a stack structure of a p dopant layer and an n dopant layer. The p dopant layer may include a p-type dopant such as HAT-CN, and the n dopant layer may include an alkali metal, an alkali earth metal, a lanthanide-based metal, or a combination thereof. However, embodiments are not limited thereto.

According to an embodiment, referring to FIG. 8, the light emitting structure EMS may include a tandem structure including two light emitting parts EU. For example, the light emitting part EU may include first and second light emitting parts EU1 and EU2, or the light emitting part EU may include first and third light emitting parts EU1 and EU3. In embodiments, the light emitting part EU may include second and third light emitting parts EU2 and EU3. For convenience of description, FIG. 8 shows an embodiment in which the light emitting part EU includes the first and second light emitting parts EU1 and EU2. The first light emitting part EU1 includes a first hole transport part HTU1, a first light emitting layer EML1, and a first electron transport part ETU1. The second light emitting part EU2 includes a second hole transport part HTU2, a second light emitting layer EML2, and a second electron transport part ETU2.

According to an embodiment, the light emitting structure EMS may include a single charge generation layer CGL between the first light emitting part EU1 and the second light emitting part EU2. Similarly to the first and second charge generation layers CGL1 and CGL2, the charge generation layer CGL may have a stack structure of a p dopant layer and an n dopant layer. The p dopant layer may include a p-type dopant such as HAT-CN, and the n dopant layer may include an alkali metal, an alkaline earth metal, a lanthanide-based metal, or a combination thereof.

The cathode electrode portion CAP is described with reference to FIGS. 9-10.

Figure 9:
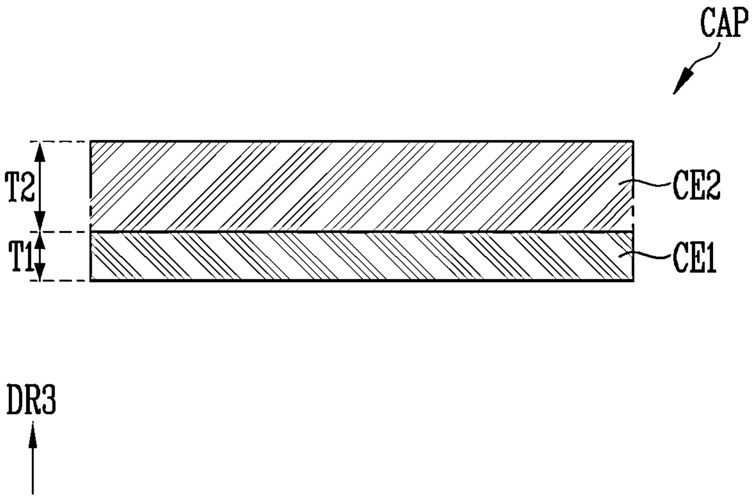
FIG. 9 is a schematic cross-sectional view illustrating a cathode electrode portion according to an embodiment.

FIG. 9 is a schematic cross-sectional view illustrating a cathode electrode portion according to an embodiment. FIG. 10 is a schematic cross-sectional view illustrating a cathode electrode portion according to an embodiment.

Figure 10:
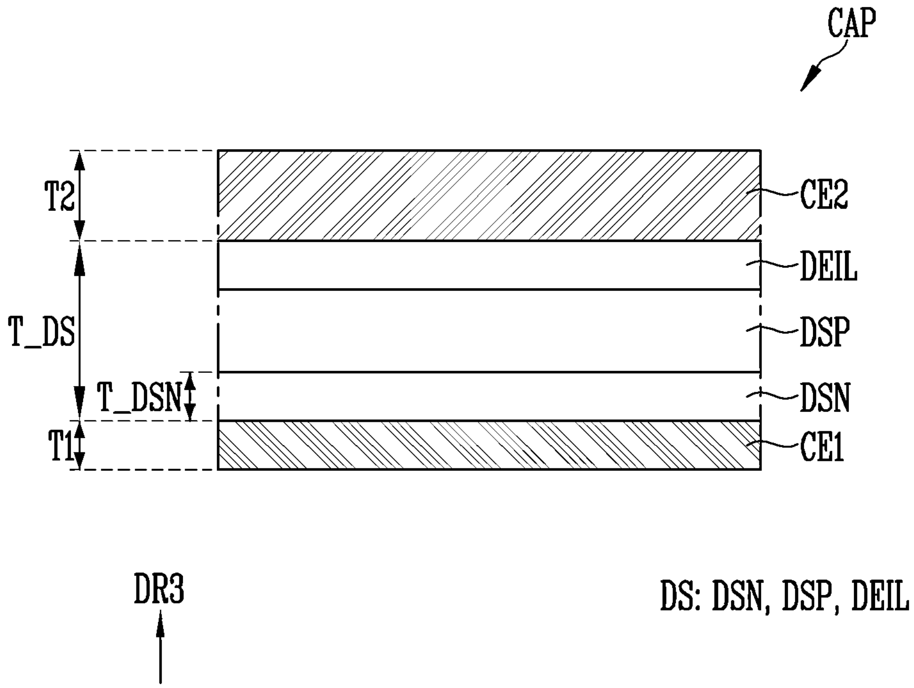
FIG. 10 is a schematic cross-sectional view illustrating a cathode electrode portion according to an embodiment.

Referring to FIGS. 9-10, the cathode electrode portion CAP according to an embodiment includes a multi-metal structure. For example, the cathode electrode portion CAP may include a first cathode electrode CE1 and a second cathode electrode CE2. For convenience of description, the disclosure is described based on an embodiment in which the cathode electrode portion CAP includes a double metal structure, but the present disclosure is not limited thereto.

Experimentally, electrical signals supplied to respective sub-pixels SP adjacent to each other are should be distinguished from each other. For example, a risk that electrical signals may be confused due to a leakage current (lateral leakage) occurring between the sub-pixels SP may occur.

For example, a separating structure (for example, the trenches TR1 and TR2 (refer to FIGS. 15, 16, and 19-20) and/or a protrusion separator PTP (refer to FIGS. 17-18) may be included in the display device 100 so that at least a portion of the light emitting structure EMS (for example, the charge generation layers CGL1 and CGL2 and the like) may be distinguished between the sub-pixels SP adjacent to each other.

The separating structure may physically separate at least a portion of the light emitting structure EMS of each of the adjacent sub-pixel SP, but a concern that a separating structure may physically separate a cathode electrode that provides a common electrode as well as the light emitting layer EML, the charge generation layers CGL1 and CGL2, and/or the like may exist. In this case, a concern that a risk such as a voltage drop may occur throughout an area where the sub-pixels SP are provided exists.

However, the cathode electrode portion CAP according to an embodiment may include at least the first and second cathode electrodes CE1 and CE2, and thus an electrical path formed by the cathode electrode portion CAP may not be cut between the adjacent sub-pixels SP (for example, in the separating structure). Accordingly, the above-described risk may be prevented or reduced.

First, referring to FIG. 9, a cathode electrode portion CAP according to a first embodiment is described.

The first cathode electrode CE1 may form a lower electrode portion of the cathode electrode portion CAP. The first cathode electrode CE1 may be adjacent to the light emitting structure EMS.

The second cathode electrode CE2 may form an upper electrode portion of the cathode electrode portion CAP. The second cathode electrode CE2 may be further spaced from the light emitting structure EMS than the first cathode electrode CE1.

The first cathode electrode CE1 and the second cathode electrode CE2 may include different conductive materials (e.g., electrically conductive materials that are different from each other), respectively. For example, the first cathode electrode CE1 may include an opaque conductive material (e.g., an opaque electrically conductive material), and the second cathode electrode CE2 may include a transparent conductive material (e.g., a transparent electrically conductive material).

According to an embodiment, the opaque conductive material may include one or more selected from gold (Au), silver (Ag), aluminum (Al), molybdenum (Mo), chromium (Cr), titanium (Ti), nickel (Ni), neodymium (Nd), copper (Cu), and platinum (Pt). The transparent conductive material may include one or more selected from indium zinc oxide (IZO), silver nanowire (AgNW), indium tin oxide (ITO), indium gallium zinc oxide (IGZO), antimony zinc oxide (AZO), indium tin zinc oxide (ITZO), zinc oxide (ZnO), tin oxide (SnO2), carbon nano tube, and graphene. For example, the first cathode electrode CE1 may include silver (Ag), and the second cathode electrode CE2 may include IZO. However, the disclosure is not necessarily limited thereto.

The first cathode electrode CE1 and the second cathode electrode CE2 may have different thicknesses. For example, the first cathode electrode CE1 may have a first thickness T1. The second cathode electrode CE2 may have a second thickness T2. The second thickness T2 may be greater than the first thickness T1.

Experimentally, when another cathode electrode has a single layer structure including a material of silver (Ag) and/or the like, having a thickness equal to or greater than a set or certain thickness to prevent or reduce damage to a transmittance (e.g., light transmittance) was difficult. Because of this, a risk that the other cathode electrode would be cut due to the separating structure and/or the like existed.

However, according to an embodiment, the second cathode electrode CE2 including the transparent conductive material may be thicker than the first cathode electrode CE1 including the opaque conductive material. In some embodiments, by providing a relatively thick second cathode electrode CE2 having an excellent transmittance (e.g., excellent light transmittance), a light emission efficiency of the light emitting structure EMS may be suitably or sufficiently secured, and a risk that the cathode electrode portion CAP is cut in the separating structure may be prevented or reduced as the cathode electrode portion CAP has a suitable or sufficient thickness.

According to an embodiment, the first thickness T1 may be in a range of 100 Å to 180 Å. In embodiments, the first thickness T1 may be in a range of 120 Å to 160 Å. For example, the first thickness T1 may be about 140 Å. According to an embodiment, the second thickness T2 may be in a range of 600 Å to 800 Å. In embodiments, the second thickness T2 may be in a range of 650 Å to 750 Å. For example, the second thickness T2 may be about 700 Å.

When the thicknesses T1 and T2 of the first and second cathode electrodes CE1 and CE2 satisfy the above-described numerical ranges, the light emission efficiency of the light emitting element LD may be secured, and a risk that the cathode electrode portion CAP is cut between adjacent sub-pixels SP may be reduced.

According to an embodiment, a lower surface of the first cathode electrode CE1 may be directly adjacent to the uppermost surface of the light emitting structure EMS. According to an embodiment, the first cathode electrode CE1 and the second cathode electrode CE2 may be directly adjacent to each other. For example, the first cathode electrode CE1 and the second cathode electrode CE2 may contact each other. A first surface (for example, the lower surface) of the first cathode electrode CE1 may contact one surface of the light emitting structure EMS, and a second surface (for example, an upper surface) of the first cathode electrode CE1 may contact the second cathode electrode CE2.

Next, with reference to FIG. 10, a cathode electrode portion CAP according to a second embodiment is described based on a point different from the first embodiment described above.

The cathode electrode portion CAP according to the second embodiment is different from the cathode electrode portion CAP according to the first embodiment in that the cathode electrode portion CAP according to the second embodiment further includes an intermediate structure DS between the first and second cathode electrodes CE1 and CE2.

According to an embodiment, the intermediate structure DS may be between the first cathode electrode CE1 and the second cathode electrode CE2. For example, the intermediate structure DS may include a material different from those of the first and second cathode electrodes CE1 and CE2 and may include various suitable organic materials.

The intermediate structure DS may include two or more layers. For example, the intermediate structure DS may include an N-type intermediate layer DSN, a P-type intermediate layer DSP, and an intermediate electron injection layer DEIL.

The N-type intermediate layer DSN may be between the first cathode electrode CE1 and the P-type intermediate layer DSP. For example, a surface of the N-type intermediate layer DSN may contact the first cathode electrode CE1, and another surface of the N-type intermediate layer DSN may contact the P-type intermediate layer DSP.

The N-type intermediate layer DSN may include an N-type host and a dopant. According to an embodiment, the N-type intermediate layer DSN may include various suitable materials that provide an N-type semiconductor layer, and is not limited to a particular example.

The P-type intermediate layer DSP may include a P-type host and a dopant. According to an embodiment, the P-type intermediate layer DSP may include various suitable materials that provide a P-type semiconductor layer, and is not limited to a particular example.

According to an embodiment, the intermediate structure DS may include a diode array in which the N-type intermediate layer DSN and the P-type intermediate layer DSP are adjacent to each other. In embodiments, the N-type intermediate layer DSN may be adjacent to the light emitting structure EMS, and the P-type intermediate layer DSP may be adjacent to the intermediate electron injection layer DEIL. In embodiments, even though a thickness of the intermediate structure DS increases, flow of an electron may be controlled, stability of the light emitting element LD may be secured, and a lifespan characteristic may be improved.

The intermediate electron injection layer DEIL may be between the P-type intermediate layer DSP and the second cathode electrode CE2. For example, a surface of the intermediate electron injection layer DEIL may contact the P-type intermediate layer DSP, and another surface of the intermediate electron injection layer DEIL may contact the second cathode electrode CE2.

The intermediate electron injection layer DEIL may include various suitable materials having an electron injection characteristic (for example, organic materials). For example, the intermediate electron injection layer DEIL may include one or more of the materials described above with reference to the electron transport part ETU described above.

As the intermediate electron injection layer DEIL is in the intermediate structure DS, the intermediate structure DS according to an embodiment may further prevent or reduce disconnection of the cathode electrode portion CAP, and an electron injection characteristic may be improved.

According to an embodiment, the N-type intermediate layer DSN may have an N-type intermediate thickness T_DSN. The N-type intermediate thickness T_DSN may have a thickness of 100 Å or less. For example, the N-type intermediate thickness T_DSN may be in a range of 40 Å to 100 Å. The N-type intermediate thickness T_DSN may be in a range of 60 Å to 95 Å. When the N-type intermediate thickness T_DSN exceeds 100 Å, a risk that a driving voltage is excessively increased may occur. Accordingly, when the N-type intermediate thickness T_DSN satisfies the above-described numerical ranges, a characteristic of the driving voltage regarding the light emitting element LD may be excellent.

According to an embodiment, the intermediate structure DS may have an intermediate thickness T_DS. The intermediate thickness T_DS may have a thickness of 400 Å or more. For example, the intermediate thickness T_DS may be in a range of 400 Å to 700 Å. In embodiments, the intermediate thickness T_DS may be in a range of 400 Å to 600 Å. In embodiments, the intermediate thickness T_DS may be in a range of 400 Å to 500 Å. According to an embodiment, a thickness of each of the P-type intermediate layer DSP and the intermediate electron injection layer DEIL may be set or determined so that the intermediate thickness T_DS has a thickness of 400 Å or more in a range where the N-type intermediate layer DSN satisfies the above-described numerical ranges. When the intermediate thickness T_DS has a thickness of 400 Å or more, a disconnection improvement characteristic of the cathode electrode portion CAP may be improved.

In embodiments, as the intermediate structure DS is included in the cathode electrode portion CAP, both of an excellent driving voltage characteristic and a disconnection improvement characteristic may be provided.

Hereinafter, with reference to FIGS. 11-14, a cross-sectional structure of the display device 100 according to an embodiment is described. A content that may overlap the content described above is briefly described or is not repeated.

FIGS. 11-14 are schematic cross-sectional views illustrating a display device according to an embodiment. FIGS. 11-14 are schematic cross-sectional views taken along a line I-I' of FIG. 3. For convenience of description, illustration of layers on the cathode electrode portion CAP is omitted in FIGS. 11-14.

Referring to FIGS. 11-14, the display device 100 may include the substrate SUB and the pixel-circuit layer PCL on the substrate SUB.

The pixel-circuit layer PCL may include circuit elements for each of the first to third sub-pixels SP1 to SP3. For example, the substrate SUB and the pixel-circuit layer PCL may include a transistor T_SP1 of the first sub-pixel SP1, a transistor T_SP2 of the second sub-pixel SP2, and a transistor T_SP3 of the third sub-pixel SP3.

According to an embodiment, the display device 100 may further include a reflective electrode RE. The reflective electrode RE may include a first reflective electrode RE1 of the first sub-pixel SP1, a second reflective electrode RE2 of the second sub-pixel SP2, and a third reflective electrode RE3 of the third sub-pixel SP3.

The reflective electrode RE may reflect light emitted from the light emitting structure EMS to form a light recycling structure. Accordingly, light emission efficiency of the light emitting element LD may be improved.

According to an embodiment, the display device 100 may further include a step formation layer SFL. The step formation layer SFL may be on the reflective electrode RE to change a distance between the light emitting structure EMS and the reflective electrode RE.

The step formation layer SFL may include an inorganic material. For example, the step formation layer SFL may include silicon oxide (SixOy). In embodiments, the step formation layer SFL may include tetraethyl orthosilicate (TEOS). However, the disclosure is not limited thereto.

According to an embodiment (refer to FIG. 11), the step formation layer SFL may be provided throughout the sub-pixels SP1, SP2, and SP3 and may have a similar thickness throughout the sub-pixels SP1, SP2, and SP3.

In embodiments, according to an embodiment (refer to FIG. 12), the step formation layer SFL may have a different thickness in at least a portion of the sub-pixels SP1, SP2, and SP3. For example, the step formation layer SFL in the first sub-pixel SP1 may have a thickness less than that of the step formation layer SFL in the second and third sub-pixels SP2 and SP3.

In embodiments (refer to FIG. 13), the step formation layer SFL may be in the first sub-pixel SP1 and may not be in the second and third sub-pixels SP2 and SP3. Accordingly, the light emitting structure EMS of the first sub-pixel SP1 may be formed at a position relatively higher than that of the light emitting structures EMS of the second and third sub-pixels SP2 and SP3.

According to an embodiment, when a position, a thickness, and/or the like of the step formation layer SFL are adjusted, the display device 100 having an improved luminance may be provided. For example, the light emitted from the light emitting structure EMS may be amplified by a relationship between a spatial distance at which the light is reflected and a wavelength of reflected light reflected by the reflective electrode RE, a distance between the light emitting structure EMS and the reflective electrode RE may be adjusted, and thus the display device 100 including a light emitting element LD having a high luminance characteristic may be provided.

In embodiments (refer to FIG. 14), the step formation layer SFL may not be separately provided. In embodiments, the anode electrode portion ANP may be relatively adjacent on the reflective electrode RE.

According to an embodiment, the anode electrode portion ANP may be on the step formation layer SFL. In embodiments, when the step formation layer SFL is not provided, the anode electrode portion ANP may be on the reflective electrode RE. According to an embodiment, when the display device 100 further includes a separate planarization layer, the anode electrode portion ANP may be on the planarization layer.

The anode electrode portion ANP may include a first anode electrode portion ANP1 of the first sub-pixel SP1, a second anode electrode portion ANP2 of the second sub-pixel SP2, and a third anode electrode portion ANP3 of the third sub-pixel SP3.

The first anode electrode portion ANP1 may be electrically connected to the first reflective electrode RE1. The second anode electrode portion ANP2 may be electrically connected to the second reflective electrode RE2. The third anode electrode portion ANP3 may be electrically connected to the third reflective electrode RE3.

The pixel defining layer PDL may be adjacent to the anode electrode portion ANP. The pixel defining layer PDL may be disposed to overlap an intermediate area between adjacent sub-pixels SP. The pixel defining layer PDL may overlap the anode electrode portion ANP.

The pixel defining layer PDL may include a separating structure. For example, the pixel defining layer PDL may cut at least a portion of the light emitting structure EMS between the adjacent sub-pixels SP. The separating structure of the pixel defining layer PDL is further described below with reference to FIGS. 15-18.

The light emitting structure EMS may form the light emitting element LD of each of the sub-pixels SP. For example, the light emitting structure EMS may include a first light emitting structure EMS1 of the first sub-pixel SP1, a second light emitting structure EMS2 of the second sub-pixel SP2, and a third light emitting structure EMS3 of the third sub-pixel SP3.

The first light emitting structure EMS1 may be electrically connected to the first anode electrode portion ANP1. The second light emitting structure EMS2 may be electrically connected to the second anode electrode portion ANP2. The third light emitting structure EMS3 may be electrically connected to the third anode electrode portion ANP3.

Among the first to third light emitting structures EMS1 to EMS3, at least a portion of adjacent structures may be cut by the separating structure formed by the pixel defining layer PDL. For example, when the light emitting structure EMS has the cross-sectional structure as shown in FIG. 7, the first light emitting part EU1, the first charge generation layer CGL1, the second light emitting part EU2, and the second charge generation layer CGL2 may be cut. In embodiments, when the light emitting structure EMS has the cross-sectional structure as shown in FIG. 8, the first light emitting part EU1 and the charge generation layer CGL may be cut. Accordingly, a risk of a leakage current between the adjacent sub-pixels SP may be reduced.

The cathode electrode portion CAP may be on the light emitting structures EMS of the first to third sub-pixels SP1 to SP3. According to an embodiment, the cathode electrode portion CAP may be provided across the first to third sub-pixels SP1 to SP3, and may define an electrical path formed across the first to third sub-pixels SP1 to SP3. Accordingly, the cathode electrode portion CAP may form a common electrode for the first to third sub-pixels SP1 to SP3, and each may supply a cathode signal.

In embodiments, as described above, the cathode electrode portion CAP may include a multiple cathode electrode structure, and thus the common electrode may be more stably defined.

Hereinafter, with reference to FIGS. 15-20, a separating structure according to an embodiment and a cathode electrode portion CAP disposed adjacent to the separating structure are described. A content that may overlap the content described above is briefly described or is not repeated.

Figure 17:
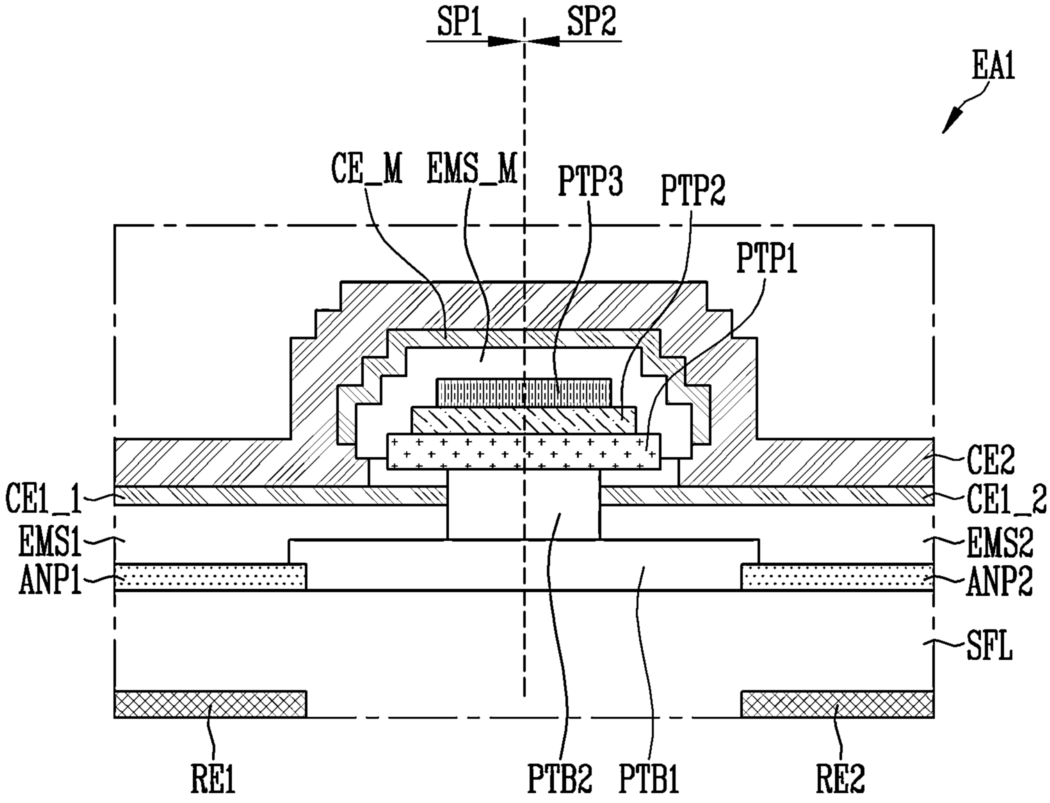
Figure 18:
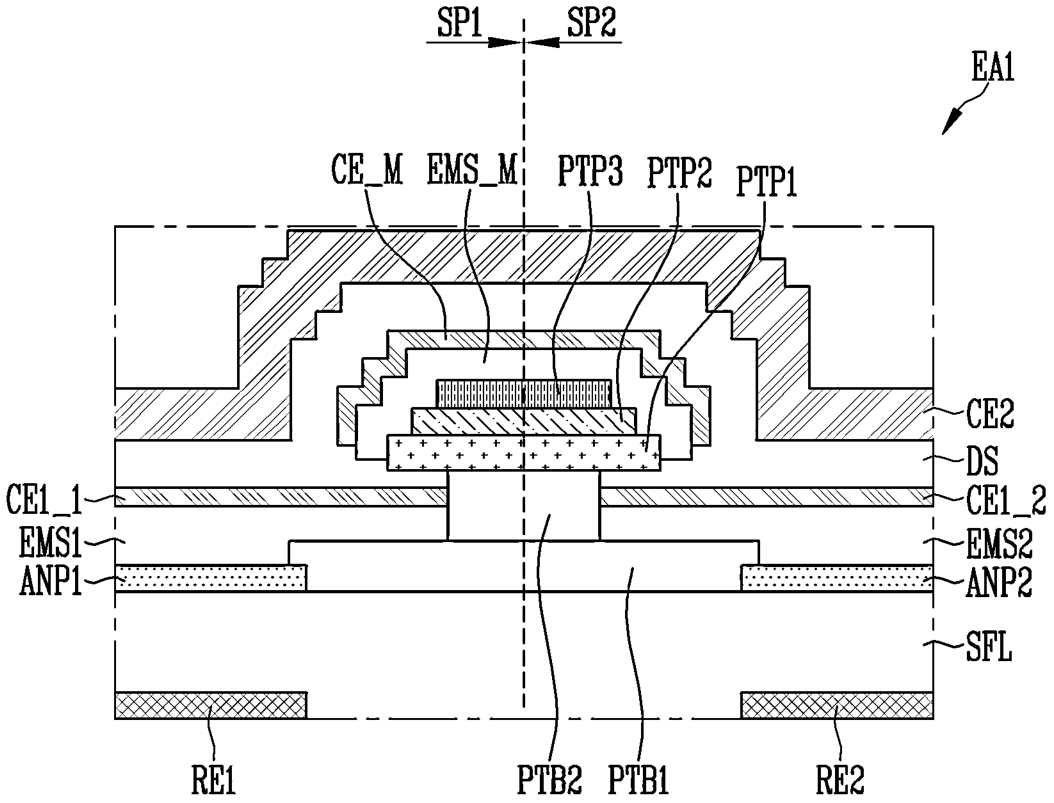
Figure 19:
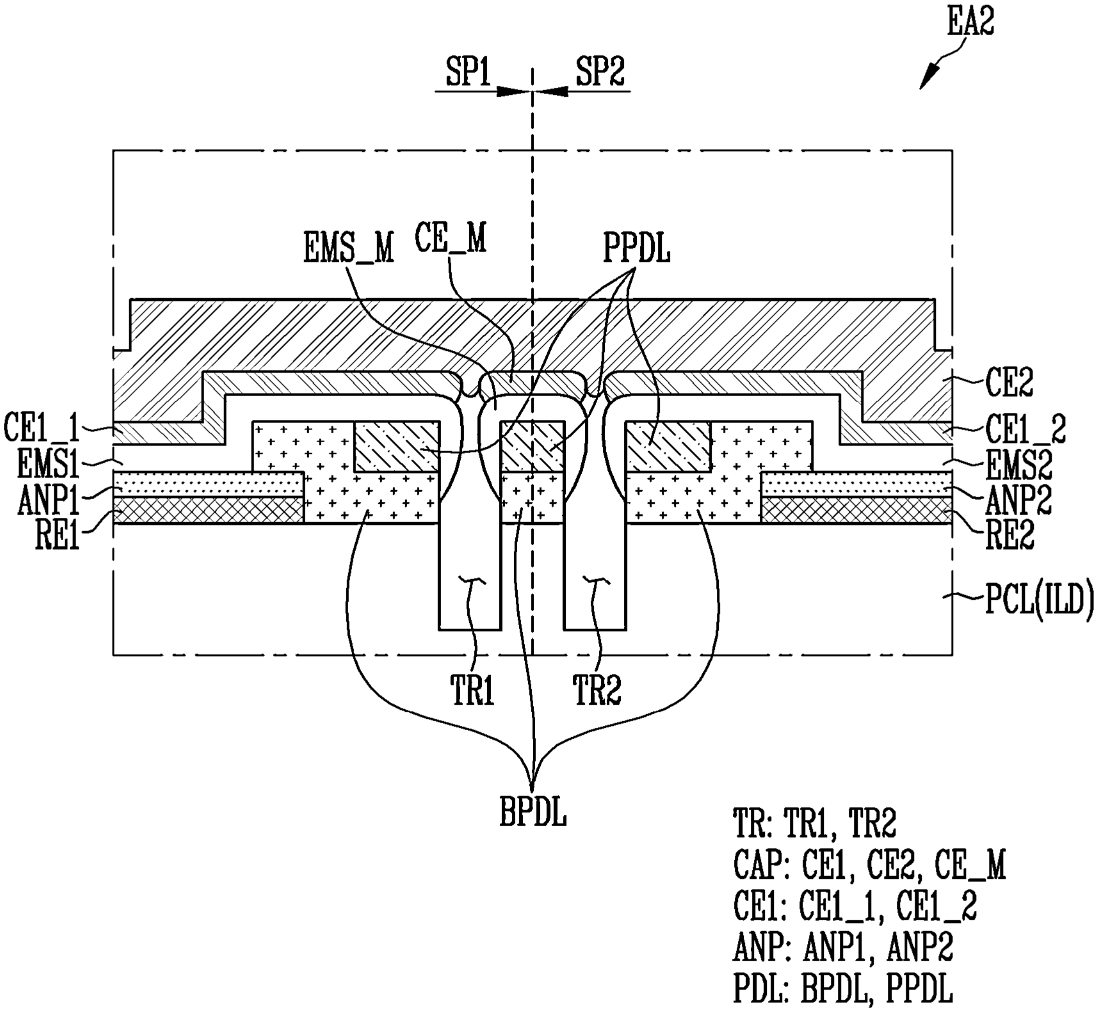
Figure 20:
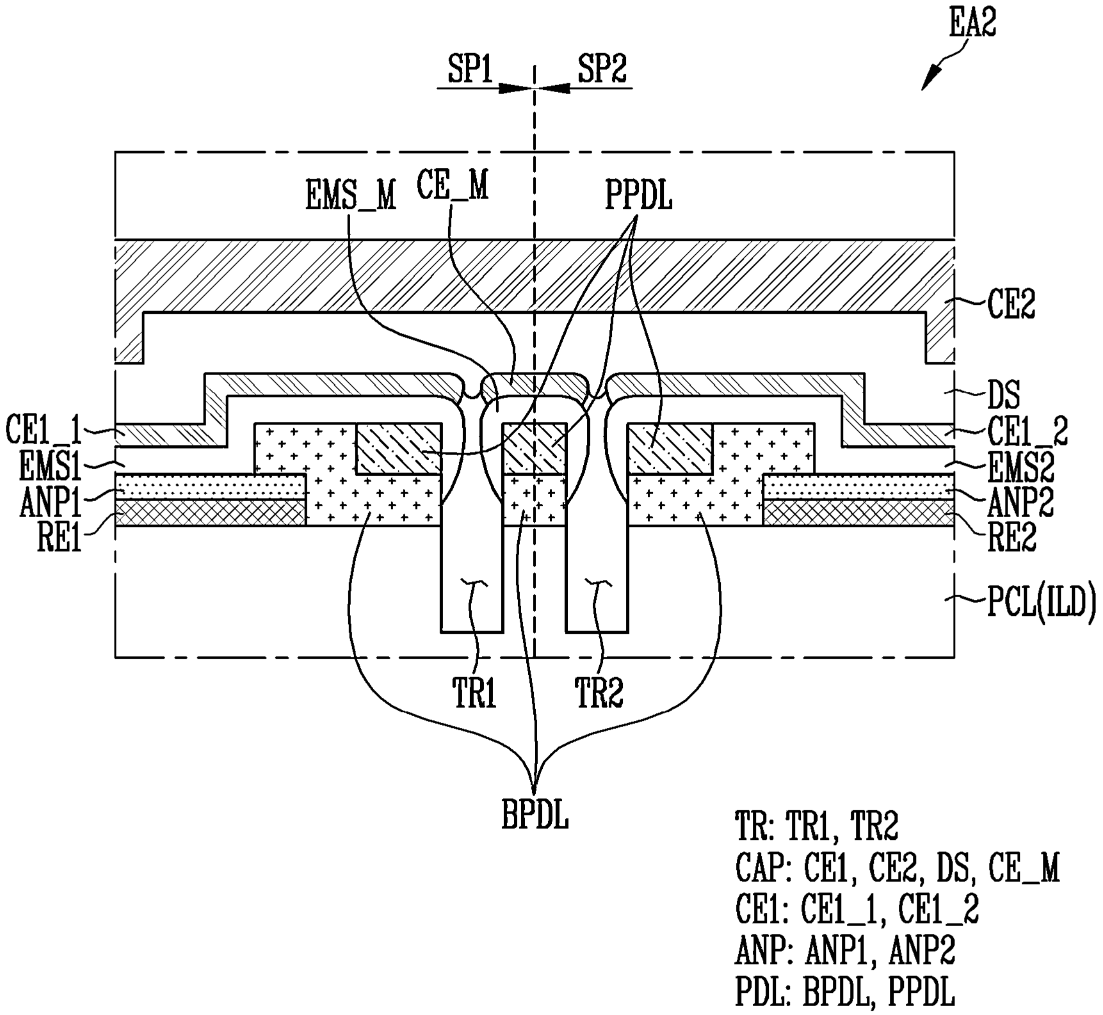

FIGS. 15-20 are schematic cross-sectional views illustrating a portion of a display device including a separating structure and a cathode electrode portion disposed adjacent to the separating structure according to an embodiment. For convenience of description, FIGS. 15-18 schematically show a cross-section of the display device 100 based on a schematic enlarged structure of an EA1 area of FIG. 11. For convenience of description, FIGS. 19-20 schematically show a cross-section of the display device 100 based on a schematic enlarged structure of an EA2 area of FIG. 14.

For example, FIGS. 15-20 show an area where the first sub-pixel SP1 and the second sub-pixel SP2 are adjacent to each other, but a similar technical feature may be equally applied to an area where the first and third sub-pixels SP1 and SP3 are adjacent to each other and an area where the second and third sub-pixels SP2 and SP3 are adjacent to each other. Each of FIGS. 15-20 shows a separating structure for cutting at least a portion of the light emitting structure EMS according to an embodiment.

Figure 15:
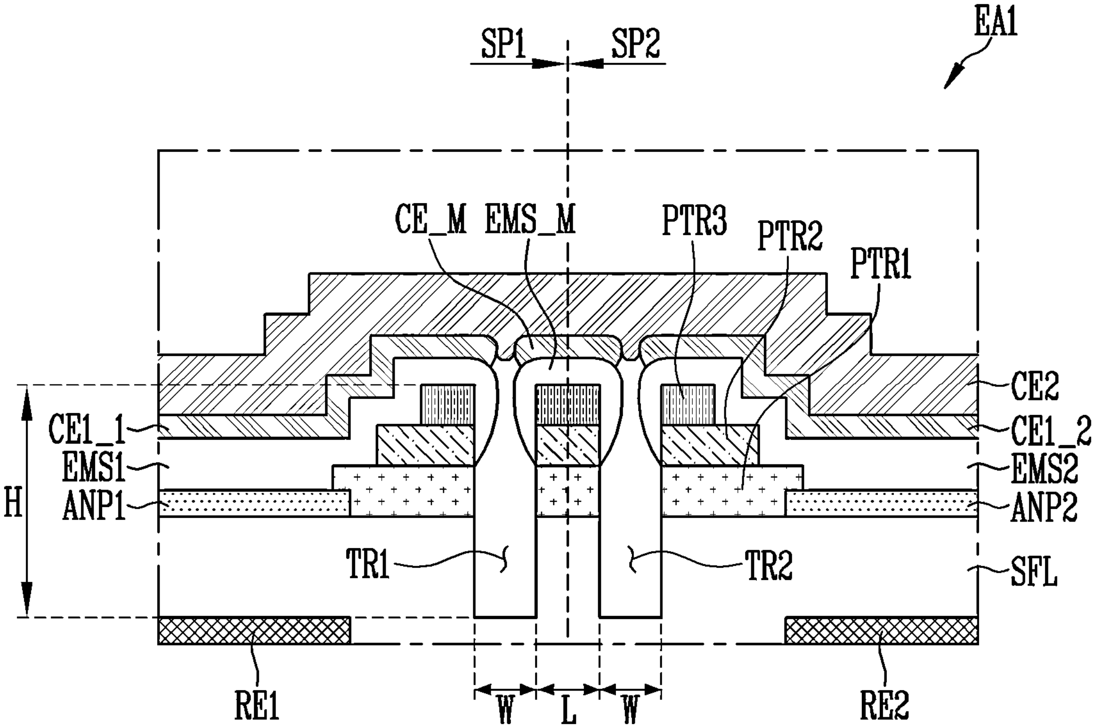
FIGS. 15-20 are schematic cross-sectional views illustrating a portion of a display device including a separating structure and a cathode electrode portion disposed adjacent to the separating structure according to an embodiment.
Figure 16:
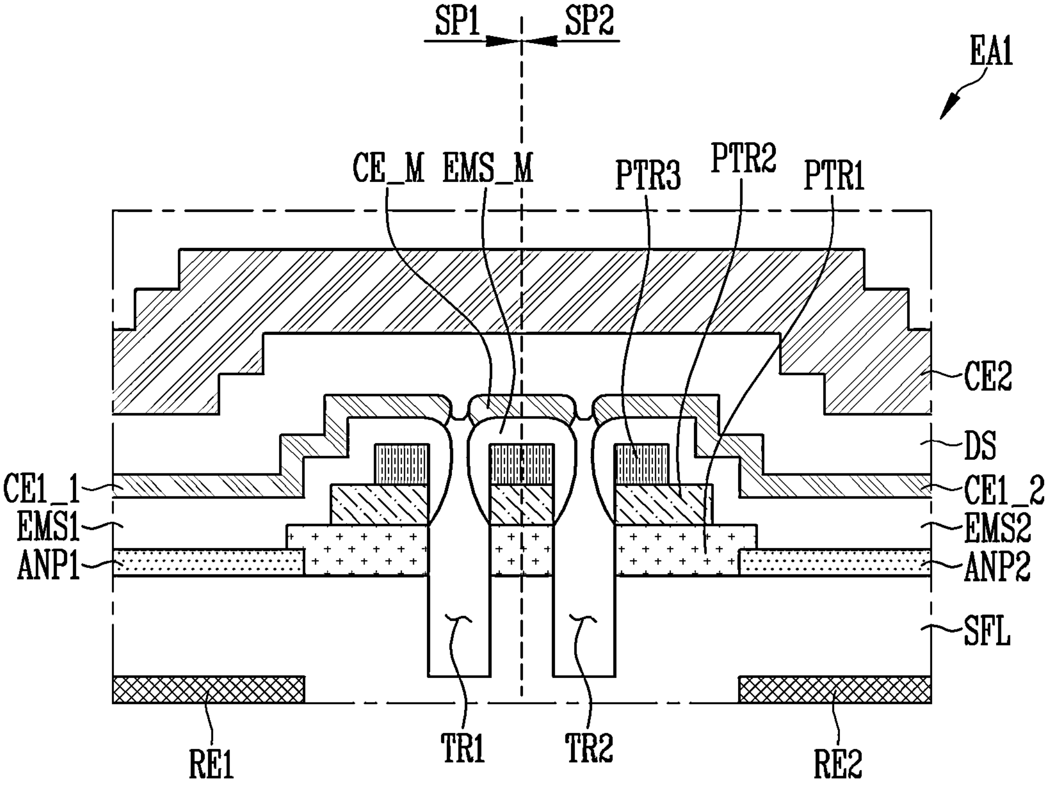

Referring to FIGS. 15-16, the pixel defining layer PDL according to an embodiment may include (or form) trenches TR.

The trenches TR may form the separating structure. The trenches TR may include a plurality of trenches TR. For example, the trenches TR may include a first trench TR1 and a second trench TR2. However, the number of trenches TR is not particularly limited, and according to an embodiment, a trench TR may be formed between the sub-pixels SP, and three or more trenches TR may be formed between the sub-pixels SP.

According to an embodiment, the pixel defining layer PDL may include a first trench formation layer PTR1, a second trench formation layer PTR2, and a third trench formation layer PTR3.

The first to third trench formation layers PTR1 to PTR3 may be sequentially provided and may have different widths. Accordingly, the first to third trench formation layers PTR1 to PTR3 may form a step. The first trench formation layer PTR1 may have a width greater than that of the second trench formation layer PTR2, and the second trench formation layer PTR2 may have a width greater than that of the third trench formation layer PTR3.

Each of the first to third trench formation layers PTR1 to PTR3 may include an inorganic material. For example, the first trench formation layer PTR1 may include silicon nitride (SixNy), the second trench formation layer PTR2 may include silicon oxide (SixOy), and the third trench formation layer PTR3 may include silicon nitride (SixNy).

The first to third trench formation layers PTR1 to PTR3 may form the trench TR. For example, the first and second trenches TR1 and TR2 may pass through the first to third trench formation layers PTR1 to PTR3 and may partially pass through the step formation layer SFL. According to an embodiment, when the step formation layer SFL is not included and a planarization layer is provided, the first and second trenches TR1 and TR2 may partially pass through the planarization layer.

Accordingly, the trenches TR may form a void in an area between the adjacent sub-pixels SP, and thus form a discontinuous portion in a boundary area between the adjacent sub-pixels SP.

Accordingly, at least a portion of the light emitting structure EMS may be cut between the adjacent sub-pixels SP, and at least a portion of the light emitting structure EMS may be bent. As described above, among layers included in the light emitting structure EMS, the first and second charge generation layers CGL1 and CGL2 may be cut by the trenches TR. In embodiments, when the light emitting structure EMS includes a single charge generation layer CGL, the charge generation layer CGL among the layers included in the light emitting structure EMS may be cut by at least the trenches TR.

In embodiments, each of the first and second trenches TR1 and TR2 may have a width W. The width W may be defined based on a direction in which the first sub-pixel SP1 and the second sub-pixel SP2 are spaced apart from each other. The width W may be in a range of 60 nm to 170 nm. In embodiments, the width W may be in a range of 80 nm to 150 nm. In embodiments, the width W may be in a range of 100 nm to 130 nm. According to an embodiment, the width W may be about 115 nm.

When the width W satisfies the above-described numerical ranges, the display device 100 may have high resolution and at least a portion of the light emitting structure EMS may be cut closely.

The first and second trenches TR1 and TR2 may have a height H. The height H may be defined based on a thickness direction (for example, the third direction DR3) of the substrate SUB. The height H may be in a range of 450 nm to 750 nm. In embodiments, the height H may be in a range of 500 nm to 700 nm. In embodiments, the height H may be in a range of 550 nm to 650 nm. According to an embodiment, the height H may be about 600 nm.

When the height H satisfies the above-described numerical ranges, a suitable or sufficient space where at least a portion of the light emitting structure EMS is to be inserted may be secured, and thus at least a portion of the light emitting structure EMS may be cut closely.

The first and second trenches TR1 and TR2 may be spaced apart from each other by a length L. The length L may be defined based on a direction in which the first sub-pixel SP1 and the second sub-pixel SP2 are spaced apart from each other. The length L may be equal to the width W. In embodiments, the length L may be greater than the width W.

The light emitting structure EMS may include an intermediate light emitting structure EMS_M formed between the first and second trenches TR1 and TR2. At least a portion of the first light emitting structure EMS1 (for example, the first and second charge generation layers CGL1 and CGL2 or the charge generation layer CGL) and at least a portion of the intermediate light emitting structure EMS_M (for example, the first and second charge generation layers CGL1 and CGL2 or the charge generation layer CGL) may be separated.

The first light emitting structure EMS1 may be on the first anode electrode portion ANP1. The first light emitting structure EMS1 may be on a portion of the pixel defining layer PDL between the first anode electrode portion ANP1 and the first trench TR1. At least a portion of the first light emitting structure EMS1 may cover an inner surface of the pixel defining layer PDL formed by the first trench TR1 and adjacent to (e.g., directly adjacent) the first anode electrode portion ANP1.

The second light emitting structure EMS2 may be on the second anode electrode portion ANP2. The second light emitting structure EMS2 may be disposed on a portion of the pixel defining layer PDL between the second anode electrode portion ANP2 and the second trench TR2. At least a portion of the second light emitting structure EMS2 may cover an inner surface of the pixel defining layer PDL formed by the second trench TR2 and adjacent to (e.g., directly adjacent) the second anode electrode portion ANP2.

The intermediate light emitting structure EMS_M may be between the first and second trenches TR1 and TR2. The intermediate light emitting structure EMS_M may be provided at an inner surface or on a portion of the pixel defining layer PDL between the first trench TR1 and the second trench TR2.

FIGS. 15-16 show that the intermediate light emitting structure EMS_M and the first and second light emitting structures EMS1 and EMS2 are entirely spaced apart from each other, but at least a portion of the intermediate light emitting structure EMS_M and the first and second light emitting structures EMS1 and EMS2 may be connected to each other. For example, in conjunction with FIG. 7 together, layers above the second charge generation layer CGL2 in each of the intermediate light emitting structure EMS_M and the first and second light emitting structures EMS1 and EMS2 may be connected to each other. In embodiments, in conjunction with FIG. 8, layers above the charge generation layer CGL in each of the intermediate light emitting structure EMS_M and the first and second light emitting structures EMS1 and EMS2 may be connected to each other.

According to an embodiment, the cathode electrode portion CAP may be provided across the sub-pixels SP to form a cathode signal path.

For example, the cathode electrode portion CAP may include the first and second cathode electrodes CE1 and CE2, and may include an intermediate cathode electrode CE_M. In embodiments, the first cathode electrode CE1 may include a (1_1)-th cathode electrode CE1_1 and a (1_2)-th cathode electrode CE1_2.

According to an embodiment, a portion of the cathode electrode portion CAP may be disconnected between the adjacent sub-pixels SP, and at least a portion of the cathode electrode portion CAP may be continuously between the adjacent sub-pixels SP.

For example, at least a portion of the first cathode electrodes CE1 may be cut by the trenches TR. The (1_1)-th cathode electrode CE1_1, the (1_2)-th cathode electrode CE1_2, and the intermediate cathode electrode CE_M may have a structure based on an electrode structure deposited in the same process, may include the same material, may be in the same layer, and may have an electrode structure separated by the first and second trenches TR1 and TR2. The second cathode electrode CE2 may be provided across the first sub-pixel SP1 and the second sub-pixel SP2.

The (1_1)-th cathode electrode CE1_1 may be on the first light emitting structure EMS1. The (1_2)-th cathode electrode CE1_2 may be on the second light emitting structure EMS2. The intermediate cathode electrode CE_M may be on the intermediate light emitting structure EMS_M.

According to an embodiment (refer to FIG. 15), the second cathode electrode CE2 may be continuously on the (1_1)-th cathode electrode CE1_1, the (1_2)-th cathode electrode CE1_2, and the intermediate cathode electrode CE_M. As described above, the second cathode electrode CE2 may have a thickness greater than that of the first cathode electrode CE1 and may include a transparent conductive material (e.g., a transparent electrically conductive material). According to an embodiment, at least a portion of the second cathode electrode CE2 may be between the (1_1)-th cathode electrode CE1_1 and the intermediate cathode electrode CE_M. At least another portion of the second cathode electrode CE2 may be between the (1_2)-th cathode electrode CE1_2 and the intermediate cathode electrode CE_M. Accordingly, a cathode connection structure may be formed closely, and a transmittance characteristic (e.g., a light transmittance characteristic) for the light emitted by the light emitting structure EMS may be excellently provided.

In embodiments, the first cathode electrode CE1 formed under the second cathode electrode CE2 may be continuously in the trenches TR. For example, similar to the second cathode electrode CE2, the first cathode electrode CE1 may not be cut in the first and second trenches TR1 and TR2, and may form a continuous cathode connection structure defined between the first and second sub-pixels SP1 and SP2. In embodiments, a cathode connection path may be formed by the first cathode electrode CE1, the second cathode electrode CE2 may also form an additional cathode connection structure, and thus a risk that the cathode connection structure is disconnected in the display device 100 may be substantially reduced.

According to an embodiment (refer to FIG. 16), the intermediate structure DS may be continuously on the (1_1)-th cathode electrode CE1_1, the (1_2)-th cathode electrode CE1_2, and the intermediate cathode electrode CE_M, and the second cathode electrode CE2 may be on the intermediate structure DS. According to an embodiment, at least a portion of the intermediate structure DS may be between the (1_1)-th cathode electrode CE1_1 and the intermediate cathode electrode CE_M. At least another portion of the intermediate structure DS may be between the (1_2)-th cathode electrode CE1_2 and the intermediate cathode electrode CE_M. According to an embodiment, among layers forming the intermediate structure DS, the P-type intermediate layer DSP and the intermediate electron injection layer DEIL may be continuously in an area where the trench TR is provided, and at least a portion of the N-type intermediate layer DSN among layers forming the intermediate structure DS may be cut in the area where the trench TR is provided. In embodiments, at least a portion of the intermediate structure DS and the second cathode electrode CE2 may be continuously between the adjacent sub-pixels SP, and thus the cathode connection structure may be formed closely. Furthermore, as described above, because the relatively thick second cathode electrode CE2 includes the transparent conductive material, a transmittance characteristic (e.g., a light transmittance characteristic) for the light emitted from the light emitting structure EMS may be excellently provided.

Referring to FIGS. 17-18, the pixel defining layer PDL according to an embodiment may include (or form) a protrusion base layer PTB and a protrusion separator PTP.

The protrusion separator PTP may form a separating structure. The protrusion separator PTP may include a structure protruding in a direction in which the sub-pixels SP are spaced apart from each other.

The protrusion base layer PTB may form a base on which the protrusion separator PTP is provided. According to an embodiment, the protrusion base layer PTB may include a single layer structure. In embodiments, the protrusion base layer PTB may include a multi-layer structure. For example, the protrusion base layer PTB may include a first protrusion base layer PTB1 and a second protrusion base layer PTB2. However, the disclosure is not limited thereto.

The protrusion separator PTP may include a multi-layer structure. For example, the protrusion separator PTP may include three layers. For example, the protrusion separator PTP may include a first protrusion separator PTP1, a second protrusion separator PTP2, and a third protrusion separator PTP3. However, the disclosure is not limited thereto. According to an embodiment, the protrusion separator PTP may include six layers. For example, the protrusion separator PTP may further include fourth to sixth protrusion separators on the first to third protrusion separators PTP1 to PTP3. In an embodiment, the protrusion separator PTP may include four layers. For example, the protrusion separator PTP may further include a fourth protrusion separator on the first to third protrusion separators PTP1 to PTP3. In the present specification, for convenience of description, the disclosure is described based on an embodiment in which the protrusion separator PTP includes the first to third protrusion separators PTP1 to PTP3, but the present disclosure is not limited thereto.

According to an embodiment, layers forming the protrusion separator PTP may have different widths, respectively. For example, the first protrusion separator PTP1, the second protrusion separator PTP2, and the third protrusion separator PTP3 may have different widths. The first protrusion separator PTP1 may have a width greater than that of the second and third protrusion separators PTP2 and PTP3. The second protrusion separator PTP2 may have a width greater than that of the third protrusion separator PTP3. The first protrusion separator PTP1, the second protrusion separator PTP2, and the third protrusion separator PTP3 may have a width greater than that of the second protrusion base PTB2.

As the first protrusion separator PTP1, the second protrusion separator PTP2, and the third protrusion separator PTP3 are formed, an uneven portion may be formed in a boundary area between the adjacent sub-pixels SP.

Accordingly, at least a portion of the light emitting structure EMS may be cut between the adjacent sub-pixels SP, and at least a portion of the light emitting structure EMS may be bent. As described above, among layers included in the light emitting structure EMS, the first and second charge generation layers CGL1 and CGL2 (or the charge generation layer CGL) may be cut by the trenches TR.

The first protrusion base layer PTB1 may be on the step formation layer SFL and may form a base on which the second protrusion base layer PTB2 and the protrusion separators PTP1, PTP2, and PTP3 are provided. The first protrusion base layer PTB1 may cover at least a portion of each of the first anode electrode portion ANP1 and the second anode electrode portion ANP2.

The second protrusion base layer PTB2 may be on the first protrusion base layer PTB1 and may form a base on which the protrusion separators PTP are provided. The second protrusion base layer PTB2 may have a width less than those of the first protrusion base layer PTB1 and the first to third protrusion separators PTP1 to PTP3.

The light emitting structure EMS may include an intermediate light emitting structure EMS_M on the protrusion separators PTP. At least a portion of the first light emitting structure EMS1 (for example, the first and second charge generation layers CGL1 and CGL2 or the charge generation layer CGL) and at least a portion of the intermediate light emitting structure EMS_M (for example, the first and second charge generation layers CGL1 and CGL2 or the charge generation layer CGL) may be separated.

According to an embodiment, the protrusion base layer PTB and the protrusion separator PTP may include an inorganic material. For example, layer(s) forming each of the protrusion base layer PTB and the protrusion separator PTP may independently include one or more selected from silicon oxide (SixOy), silicon nitride (SixNy), and silicon oxynitride (SixOyNz). For example, the first protrusion base layer PTB1, the second protrusion base layer PTB2, the first protrusion separator PTP1, the second protrusion separator PTP2, and the third protrusion separator PTP3 may independently include one or more selected from silicon oxide (SixOy), silicon nitride (SixNy), and silicon oxynitride (SixOyNz).

According to an embodiment, the layer forming the protrusion base layer PTB and the protrusion separator PTP may include a material different from another layer adjacent to the layer forming the protrusion base layer PTB and the protrusion separator PTP. For example, the protrusion base layer PTB and the protrusion separator PTP may be formed by alternately providing layers including different materials.

For example, the first protrusion separator PTP1 may include silicon nitride (SixNy), the second protrusion separator PTP2 may include silicon oxide (SixOy), and the third protrusion separator PTP3 may include silicon nitride (SixNy), and when the protrusion separator PTP further includes a fourth protrusion separator on the third protrusion separator PTP3, the fourth protrusion separator may include silicon oxide (SixOy). In embodiments, the first protrusion separator PTP1 may include silicon oxide (SixOy), the second protrusion separator PTP2 may include silicon nitride (SixNy), and the third protrusion separator PTP3 may include silicon oxide (SixOy), and when the protrusion separator PTP further includes a fourth protrusion separator on the third protrusion separator PTP3, the fourth protrusion separator may include silicon nitride (SixNy). However, the disclosure is not limited thereto.

The first light emitting structure EMS1 may cover the first anode electrode portion ANP1 and the first protrusion base layer PTB1, and may cover a side surface of the second protrusion base layer PTB2.

The second light emitting structure EMS2 may cover the second anode electrode portion ANP2 and the first protrusion base layer PTB1, and may cover the side surface of the second protrusion base layer PTB2.

The intermediate light emitting structure EMS_M may be on the first to third protrusion separators PTP1 to PTP3 and may expose the side surface of the second protrusion base layer PTB2.

According to an embodiment, the cathode electrode portion CAP may be provided across the sub-pixels SP to form a cathode signal path.

For example, the cathode electrode portion CAP may include the first and second cathode electrodes CE1 and CE2, and may include the intermediate cathode electrode CE_M, and the first cathode electrode CE1 may include the (1_1)-th cathode electrode CE1_1 and the (1_2)-th cathode electrode CE1_2. In embodiments, the second cathode electrode CE2 may be electrically connected to the (1_1)-th cathode electrode CE1_1 and the (1_2)-th cathode electrode CE1_2.

The (1_1)-th cathode electrode CE1_1 may be on the first light emitting structure EMS1. The (1_2)-th cathode electrode CE1_2 may be on the second light emitting structure EMS2. The intermediate cathode electrode CE_M may be on the intermediate light emitting structure EMS_M.

According to an embodiment (refer to FIG. 17), the second cathode electrode CE2 may be continuously on the (1_1)-th cathode electrode CE1_1, the (1_2)-th cathode electrode CE1_2, and the intermediate cathode electrode CE_M. Accordingly, the cathode electrode portion CAP may suitably or appropriately form a common electrode for the adjacent sub-pixels SP.

According to an embodiment (refer to FIG. 18), the intermediate structure DS may be continuously on the (1_1)-th cathode electrode CE1_1, the (1_2)-th cathode electrode CE1_2, and the intermediate cathode electrode CE_M, and the second cathode electrode CE2 may be on the intermediate structure DS. Accordingly, the cathode electrode portion CAP may suitably or appropriately form a common electrode for the adjacent sub-pixels SP.

In embodiments, the cathode electrode portion CAP may include the first and second cathode electrodes CE1 and CE2, and a risk that all of the cathode electrode portion CAP are cut may be reduced, by a step formed by the first to third protrusion separators PTP1 to PTP3.

With reference to FIGS. 19-20, an embodiment of the pixel defining layer PDL including (or forming) the trenches TR is described. The embodiment shown in FIGS. 19-20 is an embodiment in which the pixel defining layer PDL includes (or forms) the trenches TR, and may similarly include technical features related to the trenches TR described above with reference to FIGS. 15-16. Accordingly, the display device 100 according to an embodiment is described with reference to FIGS. 19-20, based on a point different from the display device 100 according to the embodiment described above with reference to FIGS. 15-16.

Referring to FIGS. 19-20, the pixel defining layer PDL may include a base pixel defining layer BPDL and a planarization pixel defining layer PPDL.

The trenches TR may be formed (or defined) by passing through the base pixel defining layer BPDL, the planarization pixel defining layer PPDL, and an interlayer insulating layer ILD of the pixel-circuit layer PCL. The interlayer insulating layer ILD may be a layer that forms a base on which the anode electrode portion ANP and the pixel defining layer PDL are provided, and may be a layer of an upper portion (for example, the uppermost portion) of the pixel-circuit layer PCL. The interlayer insulating layer ILD may include an inorganic material and/or an organic material, and the disclosure is not limited to a specific example. The interlayer insulating layer ILD may be a via layer.

The base pixel defining layer BPDL may cover the reflective electrodes RE1 and RE2 and the first and second anode electrode portions ANP1 and ANP2. A portion of the base pixel defining layer BPDL may be between the first trench TR1 and the second trench TR2. The base pixel defining layer BPDL may partially overlap the reflective electrodes RE1 and RE2 and the first and second anode electrode portions ANP1 and ANP2 in a plan view, and at least a portion of the base pixel defining layer BPDL may not overlap the reflective electrodes RE1 and RE2 and the first and second anode electrode portions ANP1 and ANP2 in a plan view.

The planarization pixel defining layer PPDL may cancel a step formed by the base pixel defining layer BPDL. For example, the planarization pixel defining layer PPDL may form a planarization structure. At least a portion of the planarization pixel defining layer PPDL may be on a portion of the base pixel defining layer BPDL covering the first and second anode electrode portions ANP1 and ANP2, and another portion of the planarization pixel defining layer PPDL may be on a portion of the base pixel defining layer BPDL between the first and second trenches TR1 and TR2.

Each of the base pixel defining layer BPDL and the planarization pixel defining layer PPDL may include an inorganic material. The base pixel defining layer BPDL and the planarization pixel defining layer PPDL may include different inorganic materials, respectively. The base pixel defining layer BPDL and the planarization pixel defining layer PPDL may independently include one or more selected from silicon oxide ($Si_xO_y$), silicon nitride ($Si_xN_y$), and silicon oxynitride ($Si_xO_yN_z$). However, the disclosure is not limited thereto.

Embodiments may also provide the display device 100 in which a disconnection risk of the cathode electrode portion CAP is reduced. For example, referring to FIG. 19, because the cathode electrode portion CAP according to an embodiment includes the first and second cathode electrodes CE1 and CE2, the cathode connection structure may be closely defined. In embodiments, referring to FIG. 20, the cathode electrode portion CAP according to an embodiment may include the first and second cathode electrodes CE1 and CE2, and may further include the intermediate structure DS, and the cathode connection structure may be closely defined.

Figure 21:
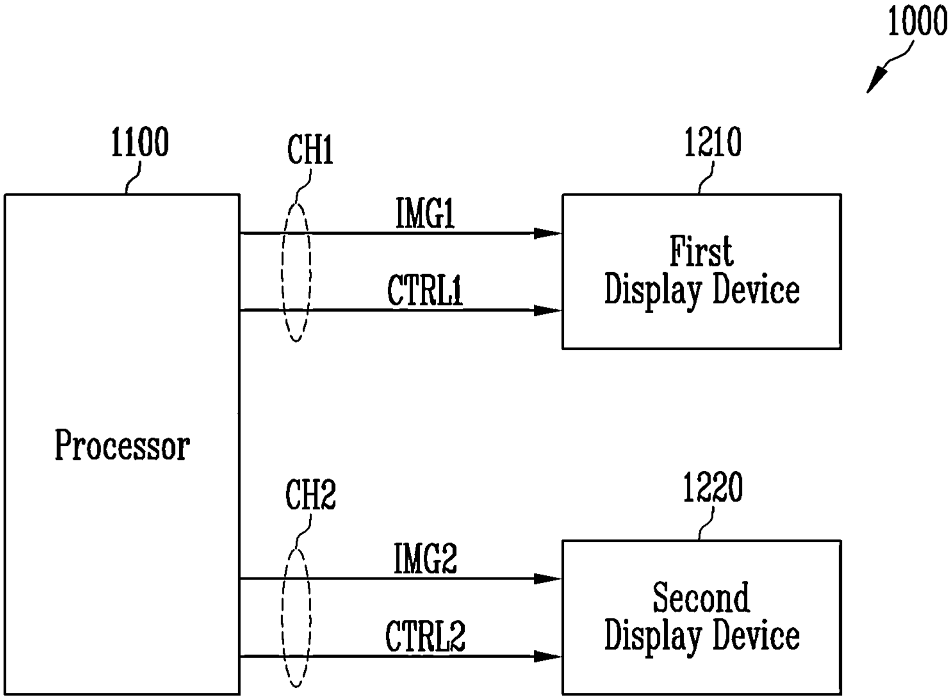
FIG. 21 is a block diagram illustrating an embodiment of a display system.

FIG. 21 is a diagram illustrating an embodiment of a display system.

Referring to FIG. 21, the display system 1000 may include a processor 1100 and one or more display devices 1210 and 1220.

The processor 1100 may perform various suitable tasks and calculations. In embodiments, the processor 1100 may include an application processor, a graphic processor, a microprocessor, a central processing unit (CPU), and/or the like. The processor 1100 may be connected to other components of the display system 1000 through a bus system and may control the other components.

In FIG. 21, the display system 1000 includes the first and second display devices 1210 and 1220. The processor 1100 may be connected to the first display device 1210 through a first channel CH1 and may be connected to the second display device 1220 through a second channel CH2.

Through the first channel CH1, the processor 1100 may transmit first image data IMG1 and a first control signal CTRL1 to the first display device 1210. The first display device 1210 may display an image based on the first image data IMG1 and the first control signal CTRL1. The first display device 1210 may be configured similarly to the display device 100 described with reference to FIG. 1.

Through the second channel CH2, the processor 1100 may transmit second image data IMG2 and a second control signal CTRL2 to the second display device 1220. The second display device 1220 may display an image based on the second image data IMG2 and the second control signal CTRL2. The second display device 1220 may be configured similarly to the display device 100 described with reference to FIG. 1.

The display system 1000 may include a computing system providing an image display function, such as a portable computer, a mobile phone, a smart phone, a tablet personal computer (PC), a smart watch, a watch phone, a portable multimedia player (PMP), a navigation device, and/or an ultra mobile personal computer (UMPC). In embodiments, the display system 1000 may include at least one selected from a head mounted display (HMD) device, a virtual reality (VR) device, a mixed reality (MR) device, and an augmented reality (AR) device.

Figure 22:
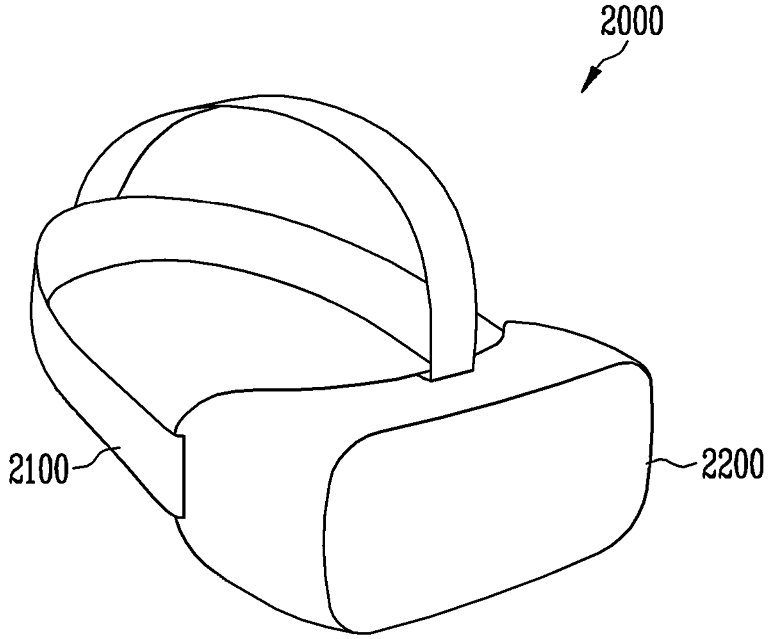
FIG. 22 is a perspective view illustrating an application example of an embodiment of the display system of FIG. 21.

FIG. 22 is a perspective view illustrating an application example of the display system of FIG. 21.

Referring to FIG. 22, the display system 1000 of FIG. 21 may be applied to a head mounted display device 2000. The head mounted display device 2000 may be a wearable electronic device that may be worn on a user's head.

The head mounted display device 2000 may include a head mount band 2100 and a display device receiving case 2200. The head mount band 2100 may be connected to the display device receiving case 2200. The head mount band 2100 may include a horizontal band and/or a vertical band for fixing the head mounted display device 2000 to the user's head. The horizontal band may be configured to surround a side portion of the user's head, and the vertical band may be configured to surround an upper portion of the user's head. However, embodiments are not limited thereto. For example, the head mount band 2100 may be implemented in a glasses frame form, a helmet form, and/or the like.

The display device receiving case 2200 may receive the first and second display devices 1210 and 1220 of FIG. 21. The display device receiving case 2200 may further receive the processor 1100 of FIG. 21.

Figure 23:
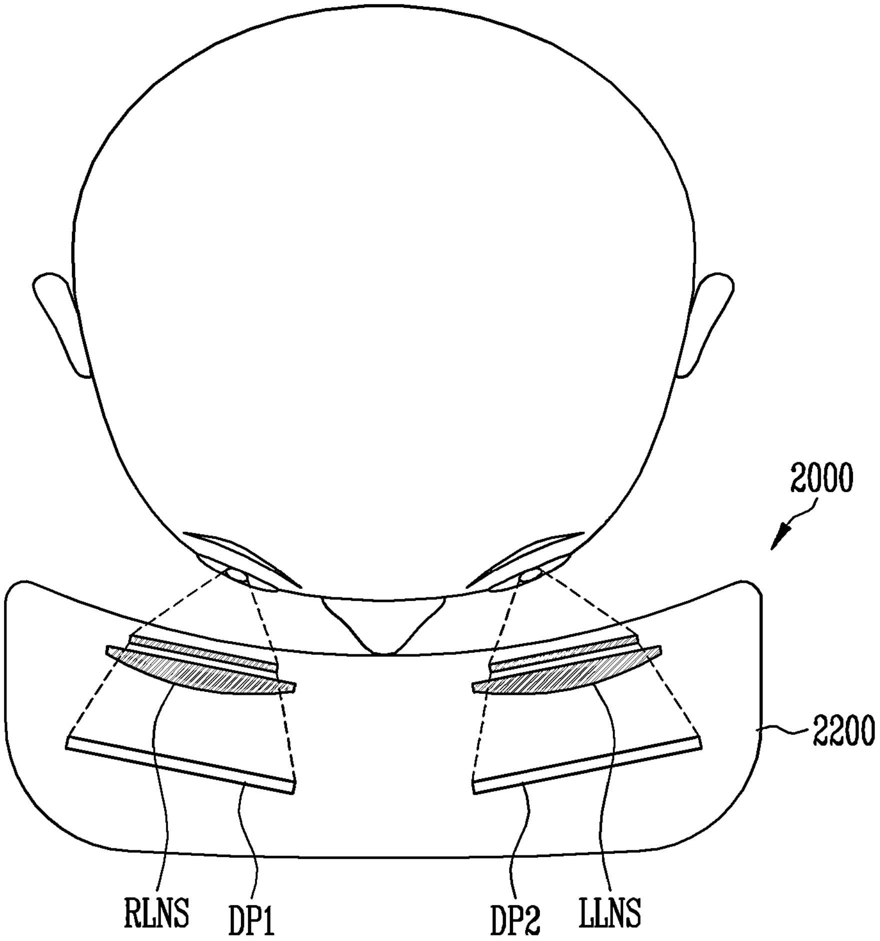
FIG. 23 is a diagram illustrating a head mounted display device worn by a user of FIG. 22.

FIG. 23 is a diagram illustrating the head mounted display device worn by a user of FIG. 22.

Referring to FIG. 23, a first display panel DP1 of the first display device 1210 and a second display panel DP2 of the second display device 1220 are in the head mounted display device 2000. The head mounted display device 2000 may further include one or more lenses LLNS and RLNS.

Within the display device receiving case 2200, the right eye lens RLNS may be between the first display device 1210 and a user's right eye. Within the display device receiving case 2200, the left eye lens LLNS may be between the second display device 1220 and a user's left eye.

An image output from the first display device 1210 may be displayed to the user's right eye through the right eye lens RLNS. The right eye lens RLNS may refract light from the first display device 1210 to be directed toward the user's right eye. The right eye lens RLNS may perform an optical function for adjusting a viewing distance between the first display device 1210 and the user's right eye.

An image output from the second display device 1220 may be displayed to the user's left eye through the left eye lens LLNS. The left eye lens LLNS may refract light from the second display device 1220 to be directed toward the user's left eye. The left eye lens LLNS may perform an optical function to adjust a viewing distance between the second display device 1220 and the user's left eye.

In embodiments, each of the right eye lens RLNS and the left eye lens LLNS may include an optical lens having a pancake-shaped cross-section. In embodiments, each of the right eye lens RLNS and the left eye lens LLNS may include a multi-channel lens including sub-areas having different optical characteristics. In embodiments, each display panel may output images respectively corresponding to the sub-areas of the multi-channel lens, and the output images may pass through the respective corresponding sub-areas and may be viewed to the user.

As described above, although the disclosure has been described with reference to example embodiments, those skilled in the art or those having a common knowledge in the art will understand that the subject matter of the disclosure may be variously modified and changed without departing from the spirit and technical area of the disclosure described in the appended claims, and equivalents thereof.

Therefore, the technical scope of the disclosure should not be limited to the contents described in the detailed description of the specification, but should be defined by the appended claims, and equivalents thereof.

What is claimed is:

1. A display device comprising:

a substrate; and a light emitting element layer on the substrate and comprising an anode electrode portion, a cathode electrode portion, a light emitting structure electrically connected between the anode electrode portion and the cathode electrode portion, and a pixel defining layer, wherein the light emitting structure comprises a first light emitting structure comprised in a first sub-pixel and a second light emitting structure comprised in a second sub-pixel adjacent to the first sub-pixel, the pixel defining layer is between the first sub-pixel and the second sub-pixel and comprises a separating structure between the first light emitting structure and the second light emitting structure, the cathode electrode portion comprises a first cathode electrode comprising an opaque conductive material and a second cathode electrode comprising a transparent conductive material, at least a portion of the first cathode electrode is cut by the separating structure, the second cathode electrode is provided across the first sub-pixel and the second sub-pixel, and the second cathode electrode has a thickness greater than that of the first cathode electrode.

2. The display device according to claim 1, wherein the first cathode electrode and the second cathode electrode contact each other.

3. The display device according to claim 2, wherein the first cathode electrode is directly adjacent to an uppermost surface of the light emitting structure.

4. The display device according to claim 1, wherein the first cathode electrode comprises one or more selected from the group consisting of gold (Au), silver (Ag), aluminum (Al), molybdenum (Mo), chromium (Cr), titanium (Ti), nickel (Ni), neodymium (Nd), copper (Cu), and platinum (Pt).

5. The display device according to claim 1, wherein the second cathode electrode comprises one or more selected from the group consisting of indium zinc oxide (IZO), silver nanowire (AgNW), indium tin oxide (ITO), indium gallium zinc oxide (IGZO), antimony zinc oxide (AZO), indium tin zinc oxide (ITZO), zinc oxide (ZnO), tin oxide (SnO2), carbon nano tube, and graphene.

6. The display device according to claim 1, wherein the first cathode electrode has a thickness in a range of 100 Å to 180 Å.

7. The display device according to claim 1, wherein the second cathode electrode has a thickness in a range of 600 Å to 800 Å.

8. The display device according to claim 1, wherein the cathode electrode portion further comprises an intermediate structure between the first cathode electrode and the second cathode electrode, and the intermediate structure comprises an N-type intermediate layer, a P-type intermediate layer on the N-type intermediate layer, and an intermediate electron injection layer on the P-type intermediate layer.

9. The display device according to claim 8, wherein the N-type intermediate layer is adjacent to the anode electrode portion, and the P-type intermediate layer is adjacent to the second cathode electrode.

10. The display device according to claim 9, wherein the N-type intermediate layer, the P-type intermediate layer, and the intermediate electron injection layer are directly adjacent to each other.

11. The display device according to claim 8, wherein the N-type intermediate layer has a thickness in a range of 40 Å to 100 Å.

12. The display device according to claim 8, wherein the intermediate structure has a thickness in a range of 400 Å to 700 Å.

13. The display device according to claim 1, wherein the separating structure has a trench that provides a void between the first sub-pixel and the second sub-pixel, and the trench comprises a plurality of trenches.

14. The display device according to claim 13, wherein the trench has a height in a range of 450 nm to 750 nm.

15. The display device according to claim 13, wherein the trench has a width in a range of 60 nm to 170 nm.

16. The display device according to claim 13, wherein the plurality of trenches comprise a first trench and a second trench, and each of the first trench and the second trench has a width that is equal to a distance at which the first trench and the second trench are spaced apart from each other.

17. The display device according to claim 13, wherein at least a portion of the first cathode electrode is cut on the trench, and the second cathode electrode is continuously provided on the trench.

18. The display device according to claim 13, wherein the pixel defining layer comprises a first trench formation layer covering at least a portion of the anode electrode portion, a second trench formation layer having a width less than that of the first trench formation layer and on the first trench formation layer, and a third trench formation layer having a width less than that of the second trench formation layer and on the second trench formation layer.

19. The display device according to claim 18, wherein the first trench formation layer comprises silicon nitride (SixNy), the second trench formation layer comprises silicon oxide (SixOy), and the third trench formation layer comprises silicon nitride (SixNy).

20. The display device according to claim 16, wherein the light emitting structure further comprises an intermediate light emitting structure on a portion of the pixel defining layer between the first trench and the second trench, the cathode electrode portion further comprises an intermediate cathode electrode on the same layer as the first cathode electrode and on the intermediate light emitting structure, and the intermediate cathode electrode and the first cathode electrode are spaced apart from each other.

21. The display device according to claim 1, wherein the pixel defining layer comprises a protrusion base layer and a protrusion separator on the protrusion base layer.

22. The display device according to claim 21, wherein the protrusion base layer comprises a first protrusion base layer covering the anode electrode portion and a second protrusion base layer on the first protrusion base layer and having a width less than that of the first protrusion base layer, and the protrusion separator comprises a first protrusion separator on the second protrusion base layer and having a width greater than that of the second protrusion base layer, a second protrusion separator on the first protrusion separator and having a width less than that of the first protrusion separator, and a third protrusion separator on the second protrusion separator and having a width less than that of the second protrusion separator.

23. The display device according to claim 22, wherein the light emitting structure further comprises an intermediate light emitting structure on the protrusion separator, the cathode electrode portion further comprises an intermediate cathode electrode on the intermediate light emitting structure and spaced apart from the first cathode electrode, and the second cathode electrode covers the intermediate cathode electrode and is provided across the first sub-pixel and the second sub-pixel.

24. The display device according to claim 1, wherein the pixel defining layer comprises a base pixel defining layer and a planarization pixel defining layer on the base pixel defining layer and canceling out a step formed by the base pixel defining layer.

25. The display device according to claim 1, wherein the light emitting structure comprises a tandem structure, the tandem structure comprises a first light emitting part, a first charge generation layer on the first light emitting part, a third light emitting part on the first charge generation layer, a second charge generation layer on the third light emitting part, and a second light emitting part on the second charge generation layer, each of the first light emitting part, the second light emitting part, and the third light emitting part comprises a hole transport part, a light emitting layer, and an electron transport part, and the first charge generation layer and the second charge generation layer are cut by the separating structure.

26. The display device according to claim 1, wherein the light emitting structure comprises a tandem structure, the tandem structure comprises a first light emitting part, a charge generation layer on the first light emitting part, and a second light emitting part on the charge generation layer, each of the first light emitting part and the second light emitting part comprises a hole transport part, a light emitting layer, and an electron transport part, and the charge generation layer is cut by the separating structure.

27. The display device according to claim 1, wherein the light emitting structure comprises a hole transport part, a light emitting layer, and an electron transport part, and the electron transport part comprises a first electron transport layer and a second electron transport layer including different materials.

28. The display device according to claim 1, further comprising:

a pixel-circuit layer between the substrate and the light emitting element layer and comprising a pixel circuit;

a reflective electrode on the pixel-circuit layer; and step formation layer between the reflective electrode and the anode electrode portion.

29. The display device according to claim 28, wherein the light emitting structure further comprises a third light emitting structure comprised in a third sub-pixel, and the step formation layer is in the first sub-pixel without being in the second sub-pixel and the third sub-pixel.

30. The display device according to claim 28, wherein the light emitting structure further comprises a third light emitting structure comprised in a third sub-pixel, the step formation layer is in each of the first sub-pixel, the second sub-pixel, and the third sub-pixel, and the step formation layer has a thick thickness in the second sub-pixel and the third sub-pixel compared to the first sub-pixel.

31. A display device comprising:

a substrate; and a light emitting element layer on the substrate and comprising an anode electrode portion, a cathode electrode portion, a light emitting structure electrically connected between the anode electrode portion and the cathode electrode portion, and a pixel defining layer, wherein the light emitting structure comprises a first light emitting structure comprised in a first sub-pixel and a second light emitting structure comprised in a second sub-pixel adjacent to the first sub-pixel, the pixel defining layer is between the first sub-pixel and the second sub-pixel and has a trench between the first light emitting structure and the second light emitting structure, the trench comprises a first trench and a second trench spaced apart from each other in a direction in which the first sub-pixel and the second sub-pixel are spaced apart, a width of each of the first trench and the second trench is in a range of 80 nm to 150 nm, a height of each of the first trench and the second trench is in a range of 500 nm to 700 nm, and the cathode electrode portion comprises a first cathode electrode and a second cathode electrode comprising different materials.

32. A display device comprising:

a substrate; and a light emitting element layer on the substrate and comprising an anode electrode portion, a cathode electrode portion, a light emitting structure electrically connected between the anode electrode portion and the cathode electrode portion, and a pixel defining layer, wherein the light emitting structure comprises a first light emitting structure comprised in a first sub-pixel and a second light emitting structure comprised in a second sub-pixel adjacent to the first sub-pixel, the pixel defining layer is between the first sub-pixel and the second sub-pixel and comprises a separating structure formed between the first light emitting structure and the second light emitting structure, the cathode electrode portion comprises a first cathode electrode, a second cathode electrode comprising a material different from that of the first cathode electrode, and an intermediate structure between the first cathode electrode and the second cathode electrode, and the intermediate structure comprises an N-type intermediate layer, a P-type intermediate layer on the N-type intermediate layer, and an intermediate electron injection layer on the P-type intermediate layer.

* * * * *